United States Patent
Jung et al.

(10) Patent No.: US 11,870,469 B2
(45) Date of Patent: *Jan. 9, 2024

(54) DEVICE AND METHOD FOR ACQUIRING SYSTEM INFORMATION BY DECODING SIGNALS IN WIRELESS COMMUNICATION SYSTEM

(71) Applicant: Samsung Electronics Co., Ltd., Suwon-si (KR)

(72) Inventors: Doyoung Jung, Suwon-si (KR); Bongjin Kim, Suwon-si (KR); Taekyoung Kim, Suwon-si (KR); Ingil Baek, Suwon-si (KR); Sangkyou Ryou, Suwon-si (KR); Junhee Jeong, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

This patent is subject to a terminal disclaimer.

(21) Appl. No.: 17/939,466

(22) Filed: Sep. 7, 2022

(65) Prior Publication Data

US 2023/0041620 A1  Feb. 9, 2023

Related U.S. Application Data

(63) Continuation of application No. 16/979,022, filed as application No. PCT/KR2019/002665 on Mar. 7, 2019, now Pat. No. 11,444,681.

(30) Foreign Application Priority Data

Mar. 7, 2018  (KR) .................. 10-2018-0026985

(51) Int. Cl.
*H04B 7/08* (2006.01)
*H04B 7/06* (2006.01)
(Continued)

(52) U.S. Cl.
CPC .......... *H04B 7/088* (2013.01); *H04B 7/0617* (2013.01); *H04B 7/0632* (2013.01);
(Continued)

(58) Field of Classification Search
CPC .... H04B 7/088; H04B 7/0617; H04B 7/0632; H04B 1/7075; H04W 48/16;
(Continued)

(56) References Cited

U.S. PATENT DOCUMENTS 10,999,745 B2  5/2021  Yang et al.
2014/0334566 A1  11/2014  Kim et al.
(Continued)

FOREIGN PATENT DOCUMENTS

CN  103782636 A  5/2014
CN  105210306 A  12/2015
(Continued)

OTHER PUBLICATIONS

Ericsson, Remaining details of remaining minimum system information, 3GPP TSG RAN WG1 Meeting 90 bis, R1-1718712, Oct. 9-13, 2017, Prague, Czech Republic.
(Continued)

*Primary Examiner* — Mewale A Ambaye
(74) *Attorney, Agent, or Firm* — Jefferson IP Law, LLP

(57) ABSTRACT

The present disclosure relates to a pre-5$^{th}$-Generation (5G) or 5G communication system to be provided for supporting higher data rates Beyond 4$^{th}$-Generation (4G) communication system such as Long Term Evolution (LTE). According to various embodiments, a device of a terminal, in a wireless communication system, can include at least one processor and at least one transceiver operatively coupled to the at least one processor. The at least one transceiver configured to receive, from a base station, a first signal transmitted using a first beam of the base station and including system
(Continued)

information and receive, from the base station, a second signal transmitted using a second beam of the base station and including the system information, and the at least one processor is configured to decode the second signal in combination with the first signal, thereby enabling the system information to be acquired.

20 Claims, 16 Drawing Sheets

(51) Int. Cl.
H04W 48/16 (2009.01)
H04W 72/044 (2023.01)
H04W 72/53 (2023.01)

(52) U.S. Cl.
CPC ......... *H04W 48/16* (2013.01); *H04W 72/046* (2013.01); *H04W 72/53* (2023.01)

(58) Field of Classification Search
CPC ........... H04W 72/046; H04W 72/0493; H04W 16/28; H04W 72/06; H04W 72/08
See application file for complete search history.

(56) References Cited

U.S. PATENT DOCUMENTS

| | | | |
|---|---|---|---|
| 2015/0236774 A1 | 8/2015 | Son et al. | |
| 2015/0280802 A1* | 10/2015 | Thomas | H04B 7/063 370/312 |
| 2016/0234759 A1 | 8/2016 | Kubota et al. | |
| 2017/0187488 A1 | 6/2017 | Rico Alvarino et al. | |
| 2017/0195014 A1 | 7/2017 | Kim et al. | |
| 2018/0206244 A1 | 7/2018 | Yang et al. | |
| 2018/0227867 A1* | 8/2018 | Park | H04L 5/005 |
| 2019/0181941 A1 | 6/2019 | Kim et al. | |
| 2019/0246388 A1 | 8/2019 | Seo et al. | |
| 2019/0306847 A1 | 10/2019 | Seo et al. | |
| 2019/0327767 A1* | 10/2019 | Islam | H04B 7/0695 |
| 2020/0350972 A1* | 11/2020 | Yi | H04L 1/12 |
| 2020/0358505 A1 | 11/2020 | Park et al. | |
| 2020/0383097 A1 | 12/2020 | Laghate et al. | |
| 2021/0051754 A1* | 2/2021 | Zhou | H04W 24/10 |
| 2021/0105121 A1 | 4/2021 | Chae et al. | |

FOREIGN PATENT DOCUMENTS

| | | | |
|---|---|---|---|
| CN | 105308879 A | 2/2016 | |
| CN | 107113041 A | 8/2017 | |
| KR | 10-2013-42660 A | 4/2013 | |
| KR | 10-2017-0123577 A | 11/2017 | |
| WO | 2018/012887 A1 | 1/2018 | |
| WO | 2018/016907 A1 | 1/2018 | |
| WO | WO-2018016907 A1 * | 1/2018 | ........... H04B 7/0417 |

OTHER PUBLICATIONS

Samsung, Remaining details on remaining minimum system information delivery, 3GPP TSG RAN WG1#90b, R1-1717578, Oct. 9-13, 2017, Prague, Czech Republic.
European Search Report dated Mar. 2, 2021, issued in European Application No. 19764451.1.
Korean Office Action dated Feb. 25, 2022, issued in Korean Application No. 10-2018-0026985.
Indian Office Action dated Jun. 13, 2022, issued in Indian Application No. 202017041577.
Notice of Patent dated in Aug. 25, 2022, issued in Korean Application No. 10-2018-0026985.
European Office Action dated Feb. 8, 2023, issued in European Application No. 19764451.1.
Chinese Office Action with English translation dated Sep. 29, 2023; Chinese Appln. No. 201980017738.X.

* cited by examiner

DEVICE AND METHOD FOR ACQUIRING SYSTEM INFORMATION BY DECODING SIGNALS IN WIRELESS COMMUNICATION SYSTEM

CROSS-REFERENCE TO RELATED APPLICATION(S)

This application is a continuation application of prior application Ser. No. 16/979,022 filed on Sep. 8, 2020; which has issued as U.S. Pat. No. 11,444,681 on Sep. 13, 2022, which is a U.S. National Stage application under 35 U.S.C. § 371 of an International application number PCT/KR2019/002665 filed on Mar. 7, 2019, which is based on and claims priority of a Korean patent application number 10-2018-0026985 filed on Mar. 7, 2018, in the Korean Intellectual Property Office, the entire disclosure of each of which is incorporated by reference herein in its entirety.

TECHNICAL FIELD

The disclosure generally relates to a wireless communication system and, more particularly, to a device and method for acquiring system information in a wireless communication system.

BACKGROUND ART

To meet the demand for wireless data traffic having increased since deployment of 4G communication systems, efforts have been made to develop an improved 5G or pre-5G communication system. Therefore, the 5G or pre-5G communication system is also called a 'Beyond 4G Network' or a 'Post LTE System'.

The 5G communication system is considered to be implemented in higher frequency (mmWave) bands, e.g., 60 GHz bands, so as to accomplish higher data rates. To decrease propagation loss of the radio waves and increase the transmission distance, the beamforming, massive multiple-input multiple-output (MIMO), Full Dimensional MIMO (FD-MIMO), array antenna, an analog beam forming, large scale antenna techniques are discussed in 5G communication systems.

In addition, in 5G communication systems, development for system network improvement is under way based on advanced small cells, cloud Radio Access Networks (RANs), ultra-dense networks, device-to-device (D2D) communication, wireless backhaul, moving network, cooperative communication, Coordinated Multi-Points (CoMP), reception-end interference cancellation and the like.

In the 5G system, Hybrid FSK and QAM Modulation (FOAM) and sliding window superposition coding (SWSC) as an advanced coding modulation (ACM), and filter bank multi carrier (FBMC), non-orthogonal multiple access (NOMA), and sparse code multiple access (SCMA) as an advanced access technology have been developed.

For communication with a base station, it is essential for a terminal to acquire system information. To this end, the base station may broadcast system information periodically or upon request, and the terminal may decode a signal including the system information. A failure to decode the system information makes communication impossible, and a success rate of decoding the system information may thus have a great influence on securing service coverage.

DISCLOSURE OF INVENTION

Technical Problem

Based on the foregoing discussion, the disclosure provides a device and method for effectively acquiring system information in a wireless communication system.

The disclosure provides the device and method for increasing a decoding success rate of system information in the wireless communication system.

The disclosure provides the device and method for decoding signals including system information transmitted via multiple beams in the wireless communication system.

The disclosure provides the device and method for determining beams for decoding system information in the wireless communication system.

The disclosure provides the device and method for acquiring system information by combining signals transmitted via different beams in the wireless communication system.

The disclosure provides the device and method for storing and managing channel qualities for beams for decoding in the wireless communication system.

Solution to Problem

According to various embodiments, in the wireless communication system, a terminal device may include at least one processor and at least one transceiver operatively coupled to the at least one processor. The at least one transceiver receives, from a base station, a first signal which is transmitted using a first beam of the base station and includes system information, and receives, from the base station, a second signal which is transmitted using a second beam of the base station and includes the system information, and the at least one processor decodes the second signal in combination with the first signal, thereby enabling the system information to be acquired.

According to various embodiments of the disclosure, an operation method of a terminal in a wireless communication system may include: receiving a first signal, which is transmitted using a first beam of a base station and includes system information, from the base station; receiving a second signal, which is transmitted using a second beam of the base station and includes the system information, from the base station; and decoding the second signal by combining the first signal, thereby acquiring the system information.

Advantageous Effects of Invention

In the device and method according to various embodiments of the disclosure, a probability of acquiring system information is increased by combining and decoding signals transmitted using multiple beams.

In the device and method according to various embodiments of the disclosure, a smooth communication environment can be maintained by increasing a probability of success in decoding system information.

Effects obtainable from the disclosure may not be limited to the above-mentioned effects, and other effects which are not mentioned may be clearly understood, through the following descriptions, by those skilled in the art to which the disclosure pertains.

BEST MODE FOR CARRYING OUT THE INVENTION

The terms used in the disclosure are only used to describe specific embodiments, and are not intended to limit the disclosure. A singular expression may include a plural expression unless they are definitely different in a context. Unless defined otherwise, all terms used herein, including technical and scientific terms, have the same meaning as those commonly understood by a person skilled in the art to which the disclosure pertains. Such terms as those defined in a generally used dictionary may be interpreted to have the meanings equal to the contextual meanings in the relevant field of art, and are not to be interpreted to have ideal or excessively formal meanings unless clearly defined in the disclosure. In some cases, even the term defined in the disclosure should not be interpreted to exclude embodiments of the disclosure.

Hereinafter, various embodiments of the disclosure will be described based on an approach of hardware. However, various embodiments of the disclosure include a technology that uses both hardware and software, and thus the various embodiments of the disclosure may not exclude the perspective of software.

Hereinafter, the disclosure relates to a device and method for acquiring information essential for communication, which is system information, in a wireless communication system. Specifically, the disclosure describes a technique for acquiring system information by performing decoding by combining signals transmitted using multiple beams in a wireless communication system.

Terms referring to or related to system information (e.g., a physical broadcast channel (PBCH), an enhanced PBCH (ePBCH), an xPBCH, a master information block (MIB), a system information block (SIB), and an xSIB), terms referring to a signal (e.g., a channel, a block, and a transport instance), terms referring to a beam, terms related to resources (e.g., a symbol, a slot, a half frame, and a frame), terms related to probability (e.g., a prior probability, a posterior probability, likelihood, and a log likelihood ratio (LRR)), terms referring to network entities, terms referring to elements of a device, and the like, which are used in the following description, are illustrated for the convenience of description. Therefore, the disclosure is not limited to the terms described below, and other terms having equivalent technical meanings may be used.

The disclosure describes various embodiments by using terms used in some communication specifications (e.g., 3rd generation partnership project (3GPP)), but this is merely illustrative. Various embodiments of the disclosure may also be easily modified and applied to other communication systems.

Figure 1:
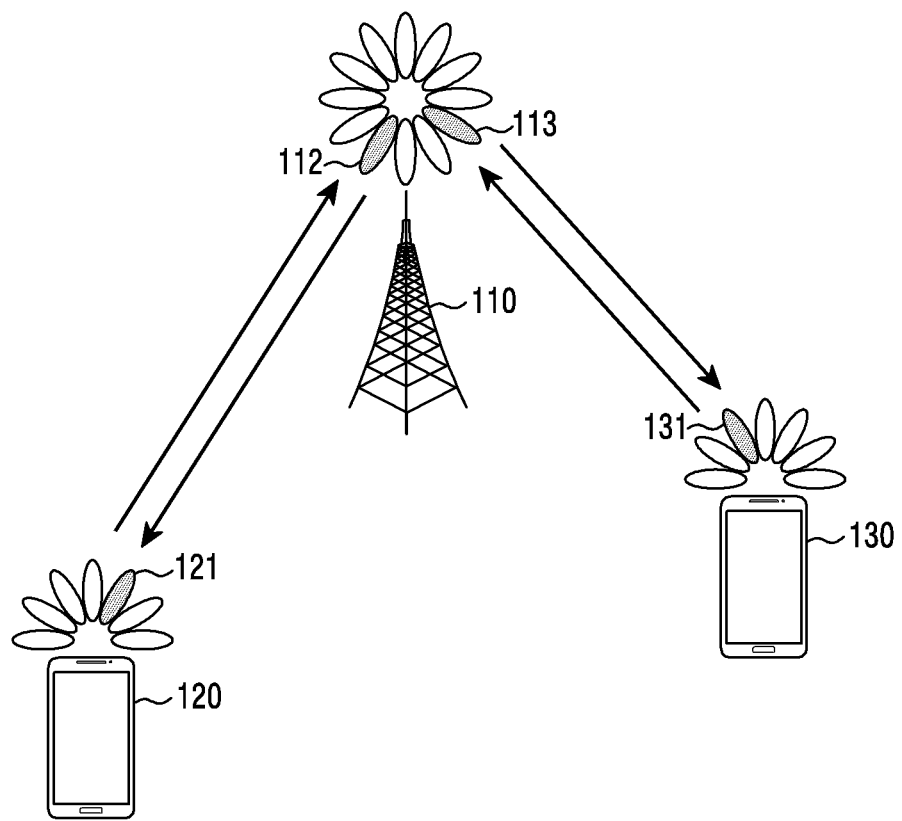
FIG. 1 illustrates a wireless communication system according to various embodiments of the disclosure.

FIG. 1 illustrates a wireless communication system according to various embodiments of the disclosure. FIG. 1 illustrates a base station 110, a terminal 120, and a terminal 130, as a part of nodes using a wireless channel in a wireless communication system.

The base station 110 is a network infrastructure that provides wireless access to the terminals 120 and 130. The base station 110 has coverage defined as a predetermined geographic area on the basis of the distance over which a signal may be transmitted. The base station 110 may be referred to as, in addition to the base station, an "access point (AP)", an "eNodeB (eNB)", a "5th generation node (5G node)", a "wireless point", or other terms having an equivalent technical meaning. According to various embodiments, the base station 110 may be connected to one or more "transmission/reception points (TRPs)". The base station 110 may transmit a downlink signal to or may receive an uplink signal from the terminal 120 or the terminal 130 via one or more TRPs.

Each of the terminal 120 and the terminal 130 is a device used by a user, and performs communication with the base station 110 via the wireless channel. In some cases, at least one of the terminal 120 and the terminal 130 may be operated without involvement of a user. That is, at least one of the terminal 120 and the terminal 130 is a device that performs machine type communication (MTC) and may not be carried by a user. Each of the terminal 120 and the terminal 130 may be referred to as, in addition to a terminal, a "user equipment (UE)", a "mobile station", a "subscriber station", a "customer premises equipment (CPE)", a "remote terminal", a "wireless terminal", an "electronic device", a "user device", or other terms having equivalent technical meaning.

The base station 110, the terminal 120, and the terminal 130 may transmit and receive wireless signals in a millimeter wave band (e.g., 28 GHz, 30 GHz, 38 GHz, and 60 GHz). At this time, in order to improve a channel gain, the base station 110, the terminal 120, and the terminal 130 may perform beamforming. The beamforming may include transmission beamforming and reception beamforming. That is, the base station 110, the terminal 120, and the terminal 130 may assign a directivity to a transmission signal or a reception signal. To this end, the base station 110 and the terminals 120 and 130 may select serving beams 112, 113, 121, and 131 via a beam search procedure or a beam management procedure. After the serving beams 112, 113, 121, and 131 are selected, communication may then be performed via resources that are in quasi co-located (QCL) relationship with resources at which the serving beams 112, 113, 121, and 131 are transmitted.

If large-scale characteristics of a channel, via which a symbol on a first antenna port has been transferred, can be inferred from a channel via which a symbol on a second antenna port has been transferred, it may be estimated that the first antenna port and the second antenna port are in a QCL relationship. For example, the large-scale characteristics may include at least one among a delay spread, a doppler spread, a doppler shift, an average gain, an average delay, and a spatial receiver parameter.

The terminal 120 may receive a signal including system information from the base station 110. The terminal 120 may receive system information before connection (e.g., radio resource control (RRC) IDLE) to the base station 110. The terminal 120 may receive system information even after being connected to the base station 110 (e.g., RRC CONNECTED). The system information may include information for generation and configuration of a connection to the base station 110 and information for configuration and controlling of an environment of communication with the base station.

The terminal 110 may transmit a signal including system information. For example, the base station 110 may broadcast a signal including system information. The base station 110 may transmit a signal via a broadcast channel (e.g., a PBCH). As another example, the base station 110 may broadcast a signal including system information via a shared channel (e.g., a physical downlink shared channel (PDSCH)). The base station 110 may periodically and repeatedly transmit a signal including system information.

The base station 110 may perform beamforming to transmit system information. The base station 110 may transmit each of signals including system information by using a different beam. The base station 110 may transmit signals via beam sweeping. The terminal 120 may acquire system information by receiving signals transmitted using beamforming. Hereinafter, the disclosure describes a method for acquiring beamforming-based system information.

Figure 2:
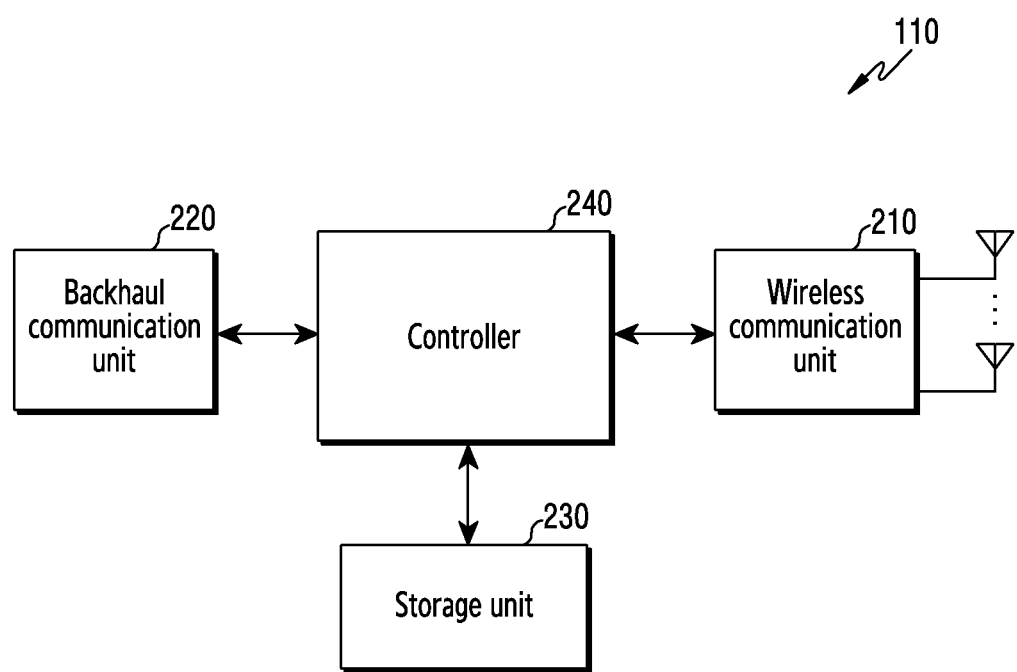
FIG. 2 illustrates an example of a configuration of a base station in the wireless communication system according to various embodiments of the disclosure.

FIG. 2 illustrates a configuration of a base station in the wireless communication system according to various embodiments of the disclosure. The configuration illustrated in FIG. 2 may be understood as a configuration of the base station 110. The terms "-unit", "-device", etc. used hereinafter refer to a unit that processes at least one function or operation, which may be implemented by hardware or software, or a combination of hardware and software.

Referring to FIG. 2, the base station 110 includes a wireless communication unit 210, a backhaul communication unit 220, a storage unit 230, and a controller 240.

The wireless communication unit 210 performs functions to transmit or receive a signal through a wireless channel. For example, the communication unit 210 performs conversion between a baseband signal and a bitstream according to a physical layer specification of a system. For example, when transmitting data, the wireless communication unit 210 generates complex symbols by encoding and modulating a transmission bitstream. When receiving data, the wireless communication unit 210 restores a received bitstream by demodulating and decoding the baseband signal. The wireless communication unit 210 up-converts the baseband signal to a radio frequency (RF) band signal, transmits the up-converted RF band signal via an antenna, and then down-converts the RF band signal received via the antenna to a baseband signal.

For example, the wireless communication unit 210 may include a transmission filter, a reception filter, an amplifier, a mixer, an oscillator, a digital-to-analog converter (DAC), an analog-to-digital converter (ADC), and the like. Also, the wireless communication unit 210 may include multiple transmission/reception paths. Furthermore, the wireless communication unit 210 may include at least one antenna array including multiple antenna elements. In terms of hardware, the wireless communication unit 210 may include a digital unit and an analog unit, wherein the analog unit includes multiple sub-units according to an operating power, an operating frequency, and the like.

The wireless communication unit 210 may transmit or receive a signal. For example, the wireless communication unit 210 may transmit a synchronization signal, a reference signal, system information, a message, control information, data, or the like. The wireless communication unit 210 may perform beamforming. In order to give directivity according to a configuration of the controller 240 to a signal to be transmitted or received, the wireless communication unit 210 may apply a beamforming weight to the signal. The wireless communication unit 210 may repeatedly transmit a signal while changing a beam that is formed.

The wireless communication unit 210 transmits and receives a signal as described above. Accordingly, all or a part of the wireless communication unit 210 may be referred to as "a transmitter", "a receiver", or "a transceiver". In the following description, transmission and reception performed via a wireless channel are used in a sense including processing performed as described above by the wireless communication unit 210.

The backhaul communication unit 220 provides an interface that performs communication with other nodes within a network. That is, the backhaul communication unit 220 converts, into a physical signal, a bitstream transmitted from the base station 110 to another node, for example, another access node, another base station, upper node, core network, etc., and converts a physical signal received from another node into a bitstream.

The storage unit 230 stores data, such as configuration information, an application program, and a basic program for operations of the base station 110. The storage unit 230 may include a volatile memory, a nonvolatile memory, or a combination of a volatile memory and a nonvolatile memory. The storage unit 230 provides stored data in response to a request of the controller 240.

The controller 240 controls overall operations of the base station 110. For example, the controller 240 transmits and receives a signal via the wireless communication unit 210 or the backhaul communication unit 220. Further, the controller 240 records and reads data in the storage unit 230. The controller 240 may perform functions of a protocol stack required by the communication standard. To this end, the controller 240 may include at least one processor. According to various embodiments, the controller 240 may control the base station 110 to perform operations described below based on various embodiments.

Figure 3:
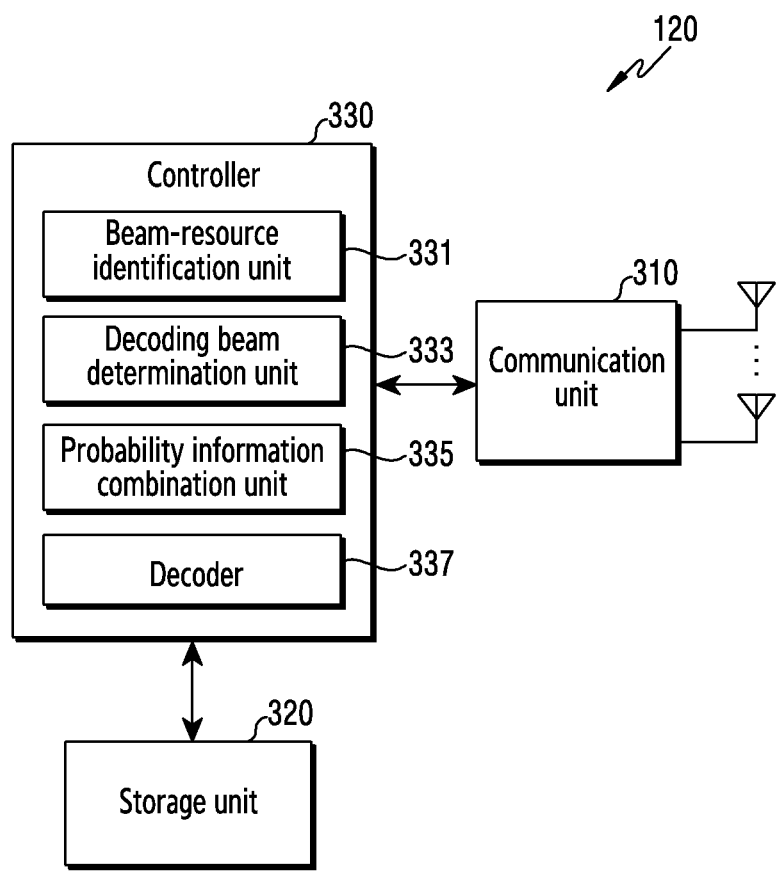
FIG. 3 illustrates an example of the configuration of the base station in the wireless communication system according to various embodiments of the disclosure.

FIG. 3 illustrates a configuration of a terminal in the wireless communication system according to various embodiments of the disclosure. The configuration illustrated in FIG. 3 may be understood as the configuration of the terminal 120. The terms "-unit", "-device", etc. used hereinafter refer to a unit that processes at least one function or operation, which may be implemented by hardware or software, or a combination of hardware and software.

Referring to FIG. 3, the terminal 120 includes a communication unit 310, a storage unit 320, and a controller 330.

The communication unit 310 performs functions for transmitting or receiving a signal via a wireless channel. For example, the communication unit 310 performs conversion between a baseband signal and a bitstream according to a physical layer specification of a system. For example, when transmitting data, the communication unit 310 generates complex symbols by encoding and modulating a transmission bitstream. When receiving data, the communication unit 310 restores a received bitstream by demodulating and decoding the baseband signal. The communication unit 310 up-converts the baseband signal into an RF band signal, transmits the up-converted RF band signal via an antenna, and then down-converts the RF band signal received via the antenna into a baseband signal. For example, the communication unit 310 may include a transmission filter, a reception filter, an amplifier, a mixer, an oscillator, a DAC, an ADC, and the like.

Also, the communication unit 310 may include a plurality of transmission/reception paths. Further, the communication unit 310 may include at least one antenna array including multiple antenna elements. In terms of hardware, the communication unit 310 may include a digital circuit and an analog circuit (e.g., a radio frequency integrated circuit (RFIC)). The digital circuit and the analog circuit may be implemented in a single package. The communication unit 310 may include a plurality of RF chains. Further, the communication unit 310 may perform beamforming. In order to give directivity according to a configuration of the controller 330 to a signal to be transmitted or received, the communication unit 310 may apply a beamforming weight to the signal. According to an embodiment, the communication unit 310 may include a radio frequency (RF) block. The RF block may include a first RF circuitry associated with an antenna and a second RF circuitry associated with baseband processing. The first RF circuitry may be referred to as RF-A (antenna). The second RF circuitry may be referred to as RF-B (baseband).

Further, the communication unit 310 may transmit or receive a signal. The communication unit 310 may receive a downlink signal. The downlink signal may include a synchronization signal (SS), a reference signal (RS) (e.g., demodulation (DM)-RS), system information (e.g., MIB, SIB, remaining system information (RMSI), and other system information (OSI)), a configuration message, control information, downlink data, or the like. The communication unit 310 may transmit an uplink signal. The uplink signal may include a random access-related signal (e.g., a random access preamble (RAP) (or message 1 (Msg1)) and message 3 (Msg3)) or a reference signal (e.g., a sounding reference signal (SRS) and a DM-RS). The communication unit 310 may include different communication modules to process signals of different frequency bands. Furthermore, the communication unit 310 may include a plurality of communication modules to support a plurality of different radio access technologies. For example, different wireless access technologies may include Bluetooth low energy (BLE), wireless fidelity (Wi-Fi), Wi-Fi gigabyte (WiGig), cellular networks (e.g., long term evolution (LTE)), new radio (NR), and the like. The different frequency bands may include a super high frequency (SHF) (e.g., 2.5 Ghz and 5 Ghz) band and a millimeter wave (e.g., 38 GHz, 60 GHz, etc.) band.

The communication unit 310 transmits and receives a signal as described above. Accordingly, all or a part of the communication unit 310 may be referred to as "a transmitter", "a receiver", or "a transceiver". In the following description, transmission and reception performed via a wireless channel are used in a sense including processing performed as described above by the wireless communication unit 310.

The storage unit 320 stores data, such as configuration information, an application program, and a basic program for operations of the terminal 120. The storage unit 320 may include a volatile memory, a nonvolatile memory, or a combination of a volatile memory and a nonvolatile memory. The storage unit 320 provides stored data in response to a request of the controller 330. According to various embodiments, the storage unit 320 may include beam information. The beam information may include information on a beam of the base station. In some embodiments, when receiving a signal transmitted using a beam of the base station, the storage 320 may store a measurement result of channel quality for the signal. In some embodiments, the storage 320 may store information on a beam (hereinafter, a decoding beam) related to decoding performed to acquire system information from among beams of the base station. The information on the decoding beam may include resource information relating to a position (e.g., a symbol, a slot, and a frame) of a resource of the decoding beam or probability information (e.g., LLR) related to the decoding beam. In some embodiments, the storage 320 may store statistical information related to the beam (e.g., the number of decoding attempts and a decoding success frequency).

The controller 330 controls overall operations of the terminal 120. For example, the controller 330 transmits and receives a signal via the communication unit 310. Further, the controller 330 records and reads data in the storage unit 320. The controller 330 may perform functions of a protocol stack required by the communication standard. To this end, the controller 330 may include at least one processor or a micro-processor, or may be a part of a processor. A part of the communication unit 310 and controller 330 may be referred to as a CP. The controller 330 may include various modules for performing communication.

According to various embodiments, the controller 330 may include a beam-resource identification unit 331, a decoding beam determination unit 333, a probability information combination unit 335, and a decoder 337. The beam-resource identification unit 331 may identify a resource in which a signal transmitted using a specific beam is located. The decoding beam determination unit 333 may determine beams for performing combined-decoding, that is, decoding beams, according to various embodiments. The probability information combination unit 335 may combine probability information of signals transmitted using the decoding beams, in order to perform combined-decoding according to various embodiments. The decoder 337 may perform decoding using a combined signal or combined probability information. Here, the beam-resource identification unit 331, the decoding-beam determination unit 333, the probability information combination unit 335, and the decoder 337 are codes or a set of instructions stored in the storage unit 320, and may be instructions/codes at least temporarily residing in the controller 330 or storage spaces storing the instructions/codes, or may be a part of circuitry constituting the controller 330, or a module for performing a function of the controller 330. According to various embodiments, the controller 330 may control the terminal to perform operations described below based on various embodiments.

The configuration of the terminal illustrated in FIG. 3 is merely an example and is not limited to the configuration illustrated in FIG. 3. That is, according to various embodiments, some elements may be added, deleted, or changed.

Figure 4A:
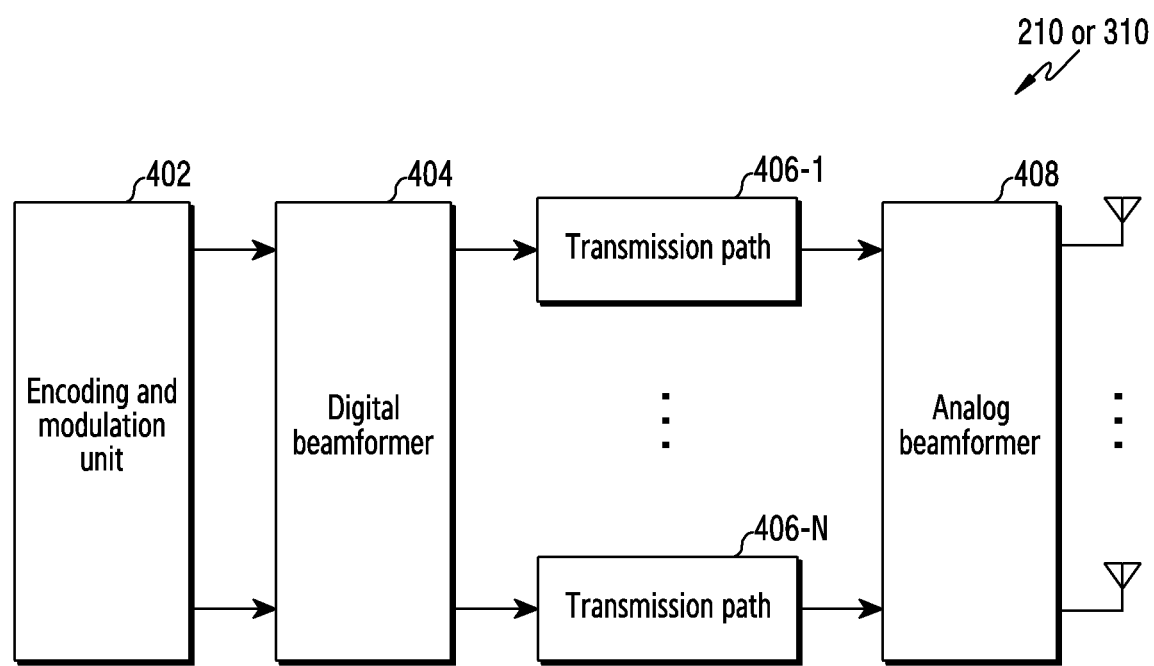
FIG. 4A to FIG. 4C illustrate a configuration of a communication unit in the wireless communication system according to various embodiments of the disclosure.
Figure 4B:
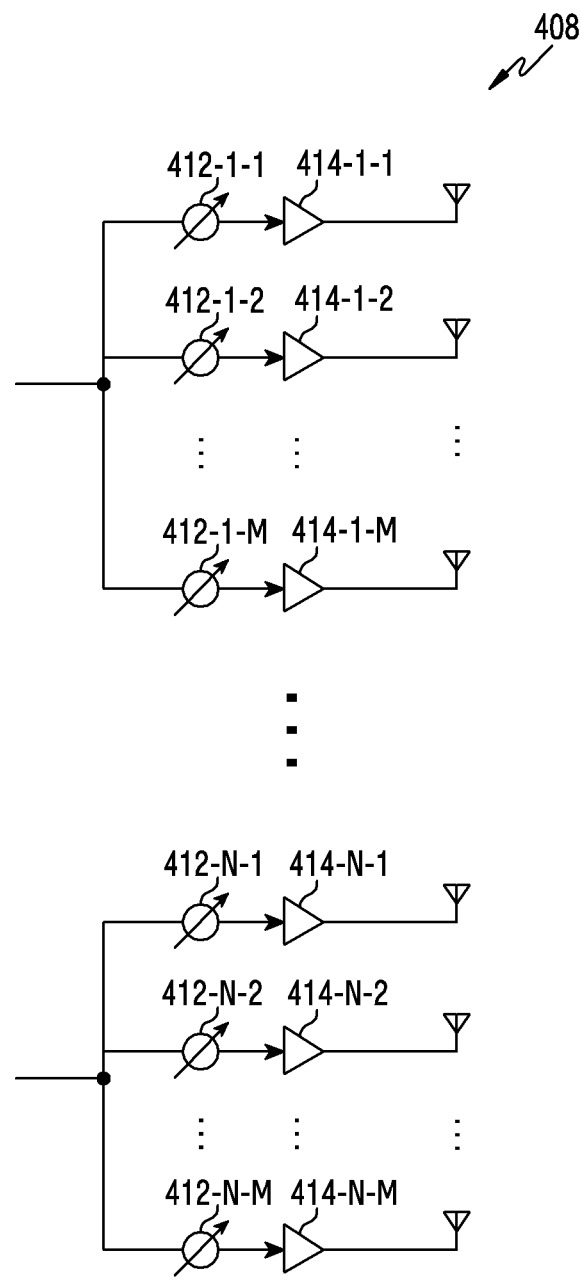
Figure 4C:
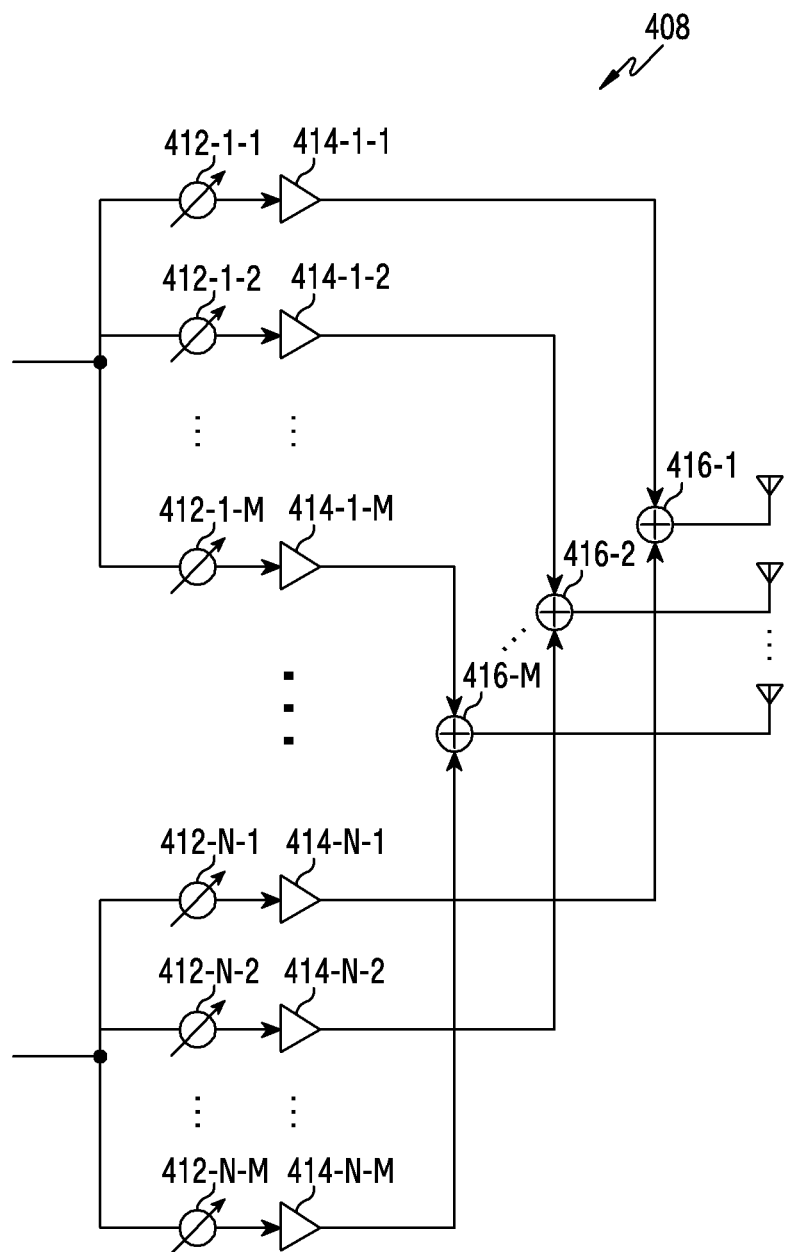

FIG. 4A to FIG. 4C illustrate a configuration of a communication unit in the wireless communication system according to various embodiments of the disclosure. FIG. 4A to FIG. 4C illustrate an example of a detailed configuration of the wireless communication unit 210 of FIG. 2 or the communication unit 310 of FIG. 3. Specifically, FIG. 4A to FIG. 4C illustrate elements to perform beamforming, as a part of the wireless communication unit 210 of FIG. 2 or the communication unit 310 of FIG. 3.

Referring to FIG. 4A, the wireless communication unit 210 or the communication unit 310 includes an encoding and modulation unit 402, a digital beamformer 404, a plurality of transmission paths 406-1 to 406-N, and an analog beamformer 408.

The encoding and modulation unit 402 performs channel encoding. For channel encoding, at least one among a low density parity check (LDPC) code, a convolution code, a polar code may be used. The encoding and modulation unit 402 generates modulation symbols by performing constellation mapping.

The digital beamformer 404 performs beamforming on a digital signal (e.g., modulation symbols). To this end, the digital beamformer 404 multiplies modulation symbols by beamforming weights. Here, the beamforming weights are used to change a magnitude and phase of a signal, and may be referred to as "a precoding matrix", "a precoder", or the like. The digital beamformer 404 outputs digital-beamformed modulation symbols to the plurality of transmission paths 406-1 to 406-N. According to a multiple input multiple output (MIMO) transmission technique, the modulation symbols may be multiplexed or the same modulation symbols may be provided to the plurality of transmission paths 406-1 to 406-N.

The plurality of transmission paths 406-1 to 406-N convert digital-beamformed digital signals into analog-signals. To this end, each of the plurality of transmission paths 406-1 to 406-N may include an inverse fast Fourier transform (IFFT) calculator, a cyclic prefix (CP) insertion unit, a DAC, and an up-converter. The CP insertion unit is for an orthogonal frequency division multiplexing (OFDM) scheme, and may be excluded when another physical layer scheme (e.g., a filter bank multi-carrier (FBMC)) is applied. That is, the plurality of transmission paths 406-1 to 406-N provide independent signal processing processes to a plurality of streams generated via digital beamforming. However, depending on an implementation scheme, some elements of the plurality of transmission paths 406-1 to 406-N may be used in common.

The analog beamformer 408 performs beamforming on an analog signal. To this end, the digital beamformer 404 multiplies analog signals by beamforming weights. The beamforming weights are used to change a magnitude and a phase of a signal. Specifically, according to a connection structure between the plurality of transmission paths 406-1 to 406-N and antennas, the analog beamformer 408 may be configured as shown in FIG. 4B or FIG. 4C.

Referring to FIG. 4B, signals input to the analog beamformer 408 are transmitted through the antennas via phase/magnitude conversion and amplification calculation. At this time, signals of respective paths are transmitted through different antenna sets, i.e., antenna arrays. Referring to processing of signals input through a first path, the signals are converted into signal sequences having different phases/magnitudes or the same phase/magnitude by phase/magnitude converters 412-1-1 to 412-1-M, amplified by the amplifiers 414-1-1 to 414-1-M, and then transmitted through the antennas.

Referring to FIG. 4C, signals input to the analog beamformer 408 are transmitted through the antennas via phase/magnitude conversion and amplification calculation. At this time, signals of respective paths are transmitted through the same antenna set, i.e., an antenna array. Referring to processing of signals input through the first path, the signals are converted into signal sequences having different phases/magnitudes or the same phase/magnitude by the phase/magnitude converters 412-1-1 to 412-1-M, and amplified by the amplifiers 414-1-1 to 414-1-M. For transmission through a single antenna array, the amplified signals are combined by combination units 416-1-1 to 416-1-M on the basis of antenna elements, and then transmitted through the antennas.

FIG. 4B shows an example in which an independent antenna array specific to each transmission path is used, and FIG. 4C shows an example in which transmission paths share one antenna array. However, according to another embodiment, some transmission paths may use an independent array, and the remaining paths may share one antenna array. Further, according to still another embodiment, a structure adaptively changeable depending on a situation may be used by applying a structure switchable between transmission paths and antenna arrays.

In order for the terminal to communicate with the base station, it is required to acquire system information. In the system according to various embodiments, the base station may transmit signals including system information by using different beams. The terminal may attempt decoding at a time resource corresponding to a specific beam (e.g., a beam having a high channel quality).

When the terminal fails to acquire system information, that is, when decoding by the terminal fails, the terminal may receive a signal including system information again and may attempt decoding. At this time, waiting until the time resource corresponding to the specific beam and attempting decoding may be inefficient. Specifically, the time to acquire system information is delayed, and therefore it may cause a decrease in coverage or a decrease in link stability.

In order to solve the above-described problems, a terminal according to various embodiments performs decoding by combining signals transmitted using different beams. The disclosure describes a method for increasing an acquisition rate of system information by performing decoding by combining signals.

Beam-Based Combined Decoding

Figure 5:
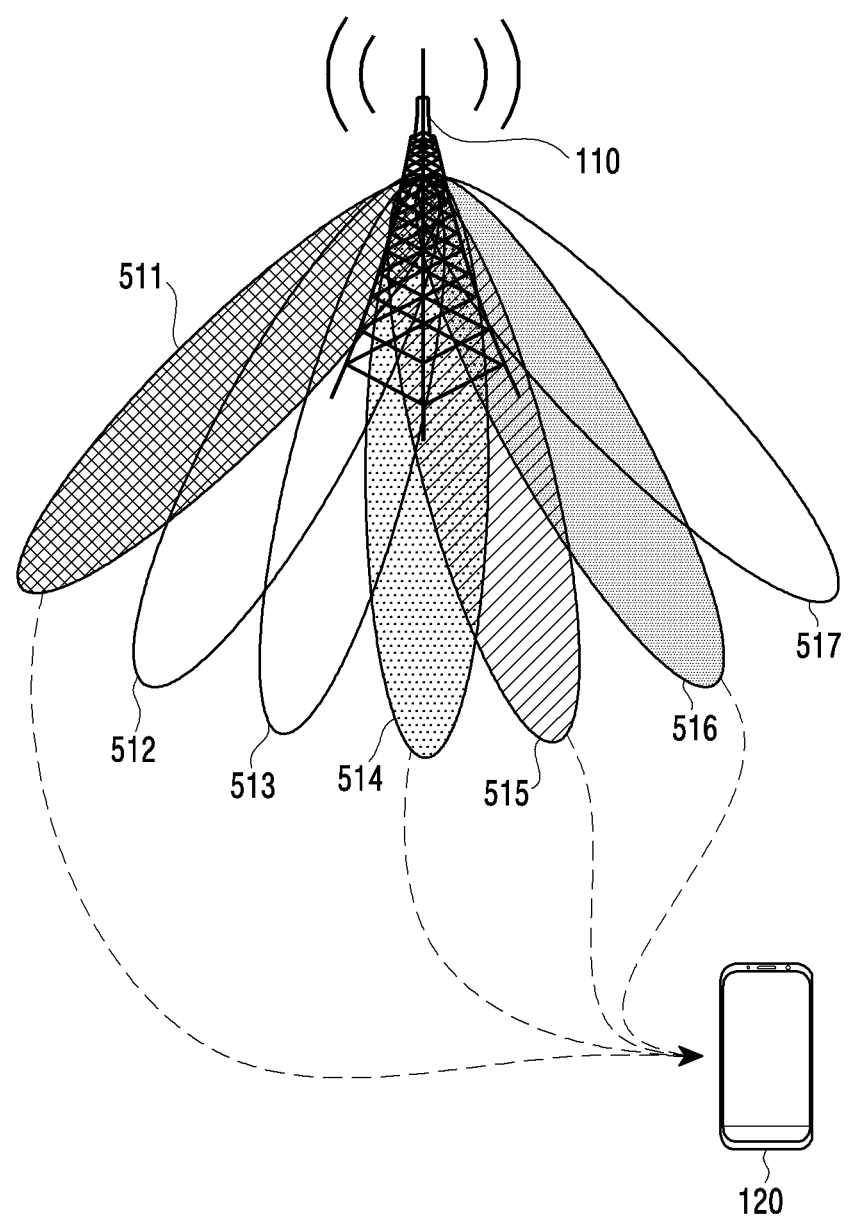
FIG. 5 illustrates an example of a beam-based combined decoding according to various embodiments of the disclosure.

FIG. 5 illustrates an example of a beam-based combined decoding according to various embodiments of the disclosure. Beam-based combined decoding refers to decoding performed by combining signals transmitted via a beamforming system. Hereinafter, beam-based combined decoding may be briefly referred to as combined decoding. In FIG. 5, terms and premised configurations required to describe the combined decoding of the disclosure are defined. However, the disclosure is not limited to the terms defined in FIG. 5, and other terms having equivalent technical meanings can be used. In FIG. 5, a situation in which a terminal receives a signal transmitted from a base station is described as an example in order to describe combined decoding. A base station may be the base station 110 of FIG. 1. A terminal may be the terminal 120 of FIG. 1.

Referring to FIG. 5, the terminal 120 may communicate with the base station 110. In order to perform communication with the base station 110, the terminal 120 is required to receive necessary information from the base station 110. Essential information for communication between the terminal and the base station may be referred to as system information. That is, the terminal 120 may receive system information from the base station 110 in order to establish or manage a connection to the base station 110.

The system information may include various types of information. According to various embodiments, the system information may include an MIB or an SIB. The MIB may include parameters necessary for acquiring information on a cell or parameters that need to be frequently transmitted. For example, the MIB may include parameters necessary to acquire SIB1. The SIB may include information for accessing the cell and parameters necessary to operate within the cell. The SIB may be defined as SIBx, such as SIB1, SIB2, etc., according to a type thereof. For example, SIB1 may include information regarding availability and scheduling of other SIBs.

According to various embodiments, the system information may include an MIB or an xSIB. The MIB may be transmitted on a broadcast channel defined as a PBCH (or xPBCH). The PBCH (or xPBCH) may refer to a broadcast channel in which beamforming is performed in each orthogonal frequency division multiplexing (OFDM) symbol for the MIB. According to an embodiment, the MIB may be acquired via an SS/PBCH block. An SIB (or xSIB) may be transmitted on the PDSCH (or a broadcast channel defined as an ePBCH) or may be transmitted. The ePBCH may refer to a broadcast channel in which beamforming is performed in each OFDM symbol for an xSIB. The xSIB may include information for accessing a cell. The xSIB may include information relating to initial cell attachment and radio resource configuration.

In addition, various terms referring to system information may be used. For example, system information may be referred to as minimum system information, remaining minimum system information (RMSI), other system information (OSI), etc. in addition to an MIB and an SIB. That is, the disclosure is not limited to only system information of a specific communication system. In addition, the system information may refer to parameters corresponding to some fields, such as an MIB, an SIB, and an xSIB. That is, the system information does not necessarily refer to one message block itself, but may also refer to specific parameters or some information in one message block.

The base station 110 transmits a signal including system information so that the terminal 120 accesses a cell of the base station 110. The base station 110 may broadcast a signal including system information so that any terminal in the cell may have access thereto. System information may be transmitted via a logical channel of a broadcast control channel (BCCH). For example, system information may be transmitted via a transmission channel of a broadcast channel (BCH). As another example, system information may be transmitted via a downlink-shared channel (DL-SCH).

Hereinafter, for the convenience of description, a signal including system information is referred to as a "system control signal". However, in addition to the system control signal, various terms may refer to a signal including system information. For example, a signal including system information may be referred to as a broadcast signal. For example, a signal including system information may be referred to as an SS block. Here, the SS block may include a synchronization signal (e.g., a primary synchronization signal (PSS) and a secondary synchronization signal (SSS)) and system information transmitted via a PBCH. The SS block may be referred to as an SS/PBCH block. In addition to this, a signal including system information may be referred to as a system signal, a configuration signal, a cell control signal, a broadcast control signal, and the like.

The base station 110 may perform beamforming. For example, the base station 110 may form a first beam 511, a second beam 512, a third beam 513, a fourth beam 514, a fifth beam 515, a sixth beam 516, and a seventh beam 517. The base station 110 may perform a beam search in order to configure a smooth beamforming communication environment with the terminal 120. A beam search is a procedure for finding a beam that guarantees a smoothest channel, and terms, such as beam sweeping or beam training and beam management, may be used to have the same or similar meaning. For example, the base station 110 may transmit a beamforming signal by using each of the first beam 511, the second beam 512, the third beam 513, the fourth beam 514, the fifth beam 515, the sixth beam 516, and the seventh beam 517.

By using at least one of the first beam 511, the second beam 512, the third beam 513, the fourth beam 514, the fifth beam 515, the sixth beam 516, and the seventh beam 517, the base station 110 may perform beamforming on system control signals including system information. The base station 110 may transmit system control signals by using a plurality of beams, so as to allow any terminal in the cell of the base station 110 to access the base station 110. The base station 110 may transmit a system control signal to any terminal in cell coverage by using a plurality of beams.

Accordingly, all terminals located on the cell of the base station 110 may acquire system information corresponding to the same content. For example, all terminals may acquire the same system frame number (SFN). For example, all terminals may acquire information on the same transmission period (e.g., an SS/PBCH occasion and a beam reference signal (BRS) transmission period). For example, the terminals may acquire information relating to other system information (e.g., numerology).

The base station 110 may transmit system control signals in a time division manner. Hereinafter, in the disclosure, a period in which system control signals are transmitted may be referred to as a broadcast period. The base station 110 may transmit system control signals in each broadcast period. In some embodiments, the broadcast period may have a fixed value. For example, the broadcast period may be 1 ms. As another example, the broadcast period may be 5 ms. In some other embodiments, the broadcast period may have a variable value. For example, the broadcast period may be adaptively configured to be one value among 5 ms, 10 ms, 20 ms, and the like. For example, the broadcast period may be notified based on system information or a configuration message.

According to various embodiments, the broadcast period of the disclosure may include various transmission periods. For example, the broadcast period may include a BRS transmission period. As another example, the broadcast period may include an ePBCH transmission period. For still another example, the broadcast period may include an SS burst. The SS burst may refer to one or more SS blocks. For still another example, the broadcast period may include an SS burst set. The SS burst set may refer to one or more SS bursts.

The base station 110 may transmit each of the system control signals by using an individual beam for each time resource in a broadcast period. Hereinafter, the disclosure is described by referring to a time resource as a system unit period in which a system control signal is transmitted. However, in addition to a system unit period, terms, such as a beam training transmission opportunity, a system information transmission opportunity, and an SS block transmission occasion, may be used to refer to a time resource at which a system control signal is transmitted. Here, the time resource may have various sizes according to a type of a broadcast period. For example, the time resource may be one OFDM symbol. As another example, the time resource may be a plurality of OFDM symbols (e.g., 4 OFDM symbols). The base station 110 transmits a system control signal by changing a beam for each system unit period. For example, the base station 110 may sequentially transmit system control signals in a total of 7 system unit periods by using the first beam 511, the second beam 512, the third beam 513, the fourth beam 514, the fifth beam 515, the sixth beam 516, and the seventh beam 517, respectively.

A broadcast period may periodically arrive. The base station 110 may transmit system control signals via different beams in a broadcast period that arrives at a predetermined period. A periodicity of a broadcast period may be referred to as a broadcast periodicity. For example, the base station 110 may transmit system control signals each time a broadcast period arrives, by using the first beam 511, the second beam 512, the third beam 513, the fourth beam 514, the fifth beam 515, the sixth beam 516, and the seventh beam 517, respectively.

System control signals transmitted via different beams may include the same system information. That is, after generating one system control signal, the base station 110 may repeatedly transmit the same system control signal by changing a beam to be used for transmission and a resource (e.g., a system unit period) allocated for the beam. In some embodiments, each of system control signals may include other additional information for each beam or each system control signal, in addition to system information common between beams. For example, the additional information may be an index of a system control signal. That is, even system control signals transmitted within the same broadcast period may include different information (i.e., different values of the same parameter). According to an embodiment, in order to acquire system information common between beams via combined decoding, a terminal may perform combined decoding by compensating for different additional information. For example, a terminal may change a part corresponding to an index of a previously received system control signal to a part corresponding to an index of a system control signal that is currently being attempted to be decoded, and then may perform combined-decoding.

The terminal 120 may receive a system control signal from the base station 110. The terminal 120 may distinguish, as a resource, system control signals transmitted via different beams. For example, in order to specify a fourth received system control signal, the terminal 120 may identify a fourth system unit period in a broadcast period. According to various embodiments, the terminal 120 may manage resource information to identify at least one of beams of the base station 110. According to an embodiment, a QCL relationship between signals corresponding to the same system resource period in different broadcast periods may be established.

The terminal 120 may determine channel qualities of signals received from the base station 110. The terminal 120 may determine a system control signal to be decoded, on the basis of the channel quality. This is because the better a channel condition, the higher a probability of successful decoding. The terminal 120 may determine a system control signal suitable for decoding according to a channel quality. That is, the terminal 120 may determine a beam suitable for decoding. Hereinafter, a beam suitable for decoding, that is, a beam used for transmission of a system control signal to be decoded is referred to as a decoding beam. The terminal 120 may determine a decoding beam. For example, the terminal 120 may select the fifth beam 515 as a beam of a channel having the best channel state. In other words, the terminal 120 may determine the fifth beam 515 as a decoding beam.

The terminal 120 may identify a system unit period corresponding to the decoding beam. The terminal 120 may attempt to decode a system control signal in the identified system unit period. For example, the terminal 120 may identify a fifth OFDM symbol corresponding to the fifth beam 515 in the broadcast period. The terminal 120 may attempt decoding in the fifth OFDM symbol of a subsequent broadcast period. As another example, the terminal 120 may identify four symbols corresponding to an SS block corresponding to the fifth beam 515 in the broadcast period. A system unit period corresponding to a decoding beam may be referred to as decoding resource(s).

If decoding in a decoding resource fails, the terminal 120 may attempt decoding again in another decoding resource. If the decoding beam is determined again in the subsequent broadcast period or if the decoding resource is identified again, a connection delay may be caused due to a waiting time. In order to reduce the delay, it is required to increase a probability of acquiring system information in the broadcast period. In order to further increase the probability of acquiring system information, the terminal 120 may perform decoding by combining a plurality of system control signals. The plurality of combined system control signals may be signals transmitted using different beams. That is, to acquire system information, the terminal 120 may combine system control signals transmitted via different beams.

The terminal 120 may determine signals to be combined. The terminal 120 may determine beams corresponding to the signals to be combined. That is, the terminal 120 may determine decoding beams. According to various embodiments, the terminal 120 may determine decoding beams on the basis of channel qualities. By performing decoding by combining at least two of system control signals corresponding to decoding beams, the terminal 120 may be able to increase a probability to acquire system information. For example, the terminal 120 may determine the first beam 511, the fourth beam 514, the fifth beam 515, and the sixth beam 516 as decoding beams. The terminal 120 may perform decoding by combining at least two of the first beam 511, the fourth beam 514, the fifth beam 515, and the sixth beam 516. The terminal 120 may acquire system information via beam-based combined decoding.

In FIG. 5, terms necessary for beam-based combined decoding are defined, and terms and background operations of communication systems are described. Hereinafter, operations of a terminal for beam-based combined decoding are described in FIG. 6A and FIG. 6B.

Figure 6A:
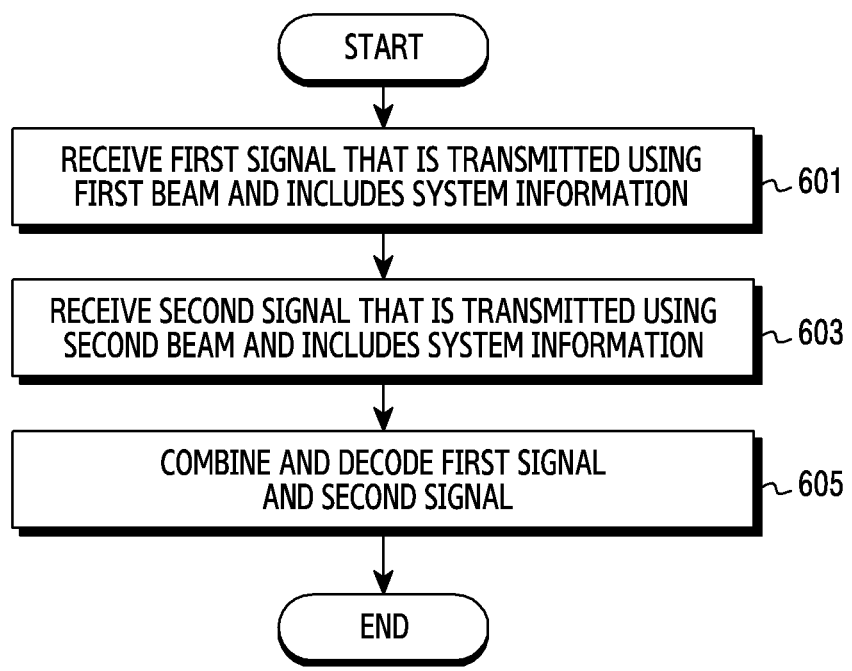
FIG. 6A and FIG. 6B illustrate flowcharts of a terminal, for the beam-based combined decoding according to various embodiments of the disclosure.

FIG. 6A illustrates a flowchart of a terminal, for beam-based combined decoding according to various embodiments of the disclosure. FIG. 6A illustrates an operation method of the terminal 120.

Referring to FIG. 6A, in operation 601, the terminal may receive a first signal that is transmitted using a first beam and includes system information. The first beam may be one of beams formed in a base station, that is, beams of the base station. The first signal may be a system control signal. The base station may generate the first signal including system information, and the base station may assign, to the first signal, a first system unit period corresponding to the first beam. The base station may transmit the first signal by using the first beam in the first system unit period. Although not illustrated in FIG. 6A, according to an embodiment, the terminal may decode the first signal.

In operation 603, the terminal may receive a second signal that is transmitted using a second beam and includes system information. The second beam may be one of beams formed in the base station. The second signal may be a system control signal. According to various embodiments, the second beam may be a beam different from the first beam. The second beam may be a beam different from the first beam from among beams used in a period in which signals including system information are repeatedly transmitted via different beams. The base station may generate the second signal including the same system information as the first signal in operation 601. The base station may assign, to the second signal, a second system unit period corresponding to the second beam. The base station may transmit the second signal by using the second beam in the second system unit period. The second system unit period may be a second decoding resource.

In operation 605, the terminal may perform decoding by combining the first signal and the second signal. That is, the terminal may perform combined-decoding. As a result, the terminal may acquire system information.

As described with reference to FIG. 6A, the terminal may perform combined decoding on system control signals transmitted via different beams. The terminal may combine the system control signals, that is, the first signal and the second signal. In the disclosure, signals may be combined in various forms. For example, the combination between signals may be a combination of information related to each signal (e.g., probability information and statistical information), as well as a combination of signals themselves. In some embodiments, the terminal may perform decoding by combining probability information relating to the second signal and probability information relating to the first signal acquired when decoding the first signal. For example, the terminal may perform decoding by adding bit-specific LLR values of the first signal and the second signal, respectively. In some other embodiments, the terminal may acquire a symbol by combining the first signal and the second signal before demodulation. For example, the terminal may acquire a symbol on the basis of phases or amplitudes of the first signal and the second signal, respectively.

Figure 6B:
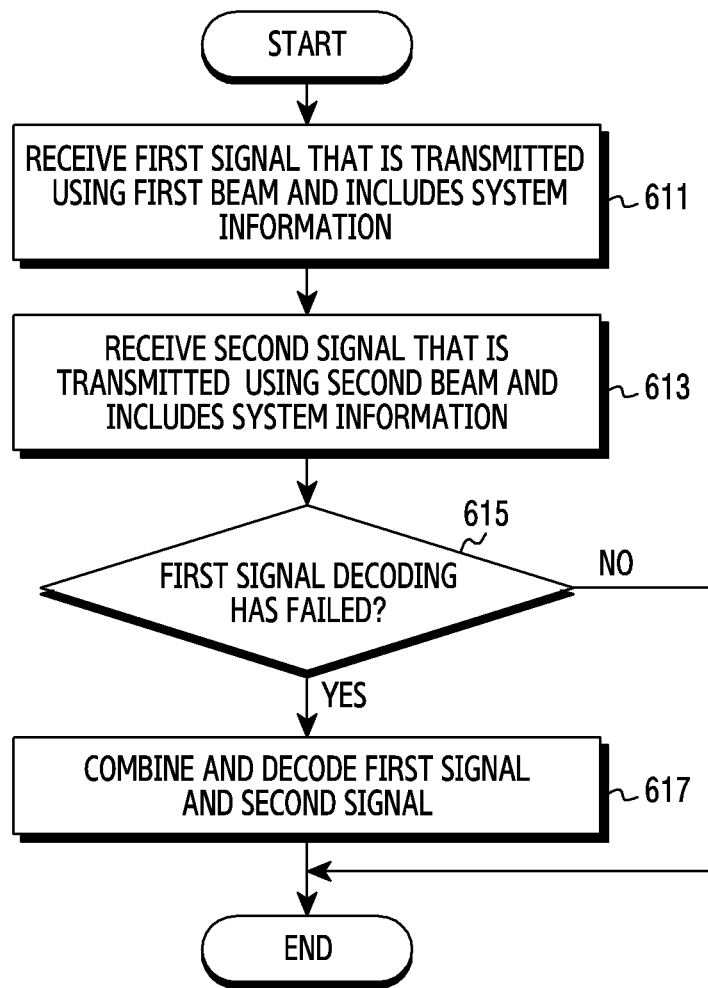

FIG. 6B illustrates a flowchart of a terminal, for beam-based combined decoding according to various embodiments of the disclosure. FIG. 6B illustrates an operation method of the terminal 120. According to various embodiments, the terminal may determine whether a condition for performing combined decoding is satisfied. Accordingly, the terminal may perform combined decoding if the condition is satisfied. FIG. 6B illustrates beam-based combined decoding according to whether the condition is satisfied.

Referring to FIG. 6B, in operation 611, the terminal may receive a first signal that is transmitted using a first beam and includes system information. Operation 611 corresponds to operation 601 of FIG. 6A, and therefore a detailed description of an overlapping configuration is omitted.

In operation 613, the terminal may receive a second signal that is transmitted using a second beam and includes system information. Operation 613 corresponds to operation 603 of FIG. 6B, and therefore a detailed description of an overlapping configuration is omitted.

In operation 615, the terminal may determine whether decoding of the first signal fails. That is, the terminal may determine whether system information is acquired, via decoding of the first signal. If the decoding of the first signal fails, the terminal may perform operation 617. If the decoding of the first signal is successful, the terminal may end decoding. That is, the terminal may not perform additional decoding in other decoding resources. The terminal may acquire system information when decoding of the first signal is successful.

In operation 617, the terminal may perform decoding by combining the first signal and the second signal. That is, when decoding of the first signal fails, the terminal may attempt combined decoding to acquire system information. The terminal may decode the second signal by combining the first signal. Instead of decoding the second signal, the terminal may perform decoding by combining the first signal and the second signal.

In FIG. 6B, a failure of decoding the first signal is described as a condition of combined decoding, but the disclosure is not limited thereto. Another decoding condition may be used instead of a failure of decoding the first signal. For example, if a channel quality for the first signal is lower than a threshold, the terminal may attempt combined decoding. Additional decoding conditions may be used in addition to a failure of decoding the first signal. For example, if decoding of the first signal fails, the terminal may decode the second signal. If decoding of the second signal also fails, the terminal may attempt combined decoding to acquire system information. After decoding of the second signal fails, the terminal may perform decoding by combining the first signal and the second signal.

FIG. 6A and FIG. 6B illustrate a combination of two signals, but the disclosure is not limited thereto. For combined decoding, more than two signals may be combined. For example, the terminal may combine three decoding beams. If decoding performed in two decoding resources fails, the terminal may perform decoding by combining a third system control signal with other system control signals in a decoding resource located at a last time point in time.

The terminal may acquire system information via combined decoding. If the terminal combines and decodes signals instead of decoding only a single signal, the terminal may successfully acquire system information with a higher probability. The terminal may access a cell via the acquired system information or may configure parameters for the cell.

Although not illustrated in FIG. 6A and FIG. 6B, the terminal may transmit feedback information indicating an optimal beam to the base station. A beam at a point of time when the system information is acquired may be different from a beam indicated by the feedback information. This is because, when combined decoding is performed, the terminal may not necessarily acquire the system information in a resource corresponding to a beam having a highest channel quality. According to various embodiments, a beam for feedback information and a beam for decoding performed when the system information is acquired may be different. Since a beam may be fed back and identified in the form (e.g., an SSB resource indicator (SSBRI) and a CRS resource indicator (CRI)) of a resource indicator, a difference between a resource indicated by the feedback information and a resource in which successful decoding has been attempted is identified, so that it may be determined whether combined-decoding according to the disclosure is performed. On the other hand, since system information may be acquired via combined decoding in a resource corresponding to a beam having an optimal channel quality, even if the beam of the feedback information and the beam related to system information acquisition are the same, it is considered that combined decoding of the disclosure is performed.

In FIG. 6A and FIG. 6B, operations of the terminal for combined decoding are described. If decoding is performed by combining arbitrary signals, decoding performance may be deteriorated. For example, if decoding is performed by combining a signal having a low channel quality and another signal, which include the same system information, the system information may be more distorted due to the signal having a low channel quality, and thus decoding may fail. Therefore, in order to perform combined decoding, the terminal is required to determine signals to be combined and decoded. That is, the terminal may determine decoding beams. Hereinafter, in FIG. 7, various schemes for determining decoding beams are described.

Decoding Beam

Figure 7:
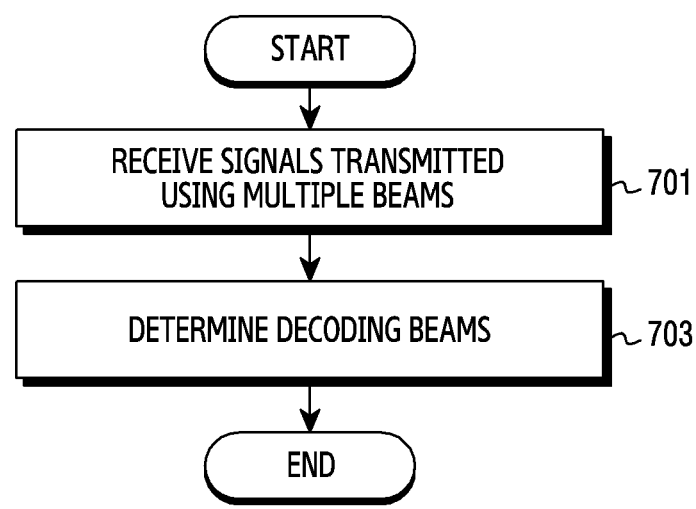
FIG. 7 illustrates a flowchart of a terminal for determining a decoding beam according to various embodiments of the disclosure.

FIG. 7 illustrates a flowchart of a terminal for determining a decoding beam according to various embodiments of the disclosure. FIG. 7 illustrates an operation method of the terminal 120. The terminal may determine decoding beams before performing the combined decoding of FIG. 6A and FIG. 6B. The decoding beams refer to beams corresponding to signals that are combined for combined decoding. The first beam and the second beam of the base station of FIG. 6A and FIG. 6B may be decoding beams of FIG. 7.

Referring to FIG. 7, in operation 701, the terminal may receive signals transmitted using a plurality of beams. The plurality of beams may be a plurality of beams formed in the base station. The base station may transmit signals by using the plurality of beams. According to various embodiments, in order to determine the decoding beams, the terminal may receive signals. In some embodiments, the terminal may receive system control signals including system information. For example, a system control signal may be an SS block including a synchronization signal. For example, the terminal may receive a plurality of SS blocks transmitted using a plurality of beams of the base station. In some other embodiments, the terminal may receive reference signals transmitted using a plurality of beams. For example, the reference signal may be at least one among a BRS, a beam refinement reference signal (BRRS), a cell-specific reference signal (CRS), a channel state information-reference signal (CSI-RS), and a demodulation-reference signal (DM-RS). For example, the terminal may receive a plurality of CSI-RSs transmitted using the plurality of beams of the base station. As another example, the terminal may receive DM-RSs transmitted using the plurality of beams of the base station.

In operation 703, the terminal may determine decoding beams. For example, the terminal may determine decoding beams on the basis of at least one of a channel quality and a correlation between beams. Specifically, the terminal may perform measurement on each of the signals received in operation 701, and may determine channel qualities or correlations between beams for the respective beams of the base station from a measurement result.

A channel quality of the disclosure may be at least one of a beam reference signal received power (BRSRP), a reference signal received power (RSRP), a reference signal received quality (RSRQ), a received signal strength indicator (RSRI), a signal to interference and noise ratio (SINR), a carrier to interference and noise ratio (CINR), a signal to noise ratio (SNR), an error vector magnitude (EVM), a bit error rate (BER), and a block error rate (BLER). In addition to the above described examples, other terms having equivalent technical meanings or other metrics indicating a channel quality may be used. Hereinafter, in the disclosure, a high channel quality refers to a case in which a channel quality value related to a signal size is large or an error rate-related channel quality value is small. A higher channel quality may mean that a smooth wireless communication environment is guaranteed. An optimal beam may refer to a beam having a highest channel quality among beams.

According to various embodiments, the terminal may determine decoding beams on the basis of channel qualities. In some embodiments, the terminal may determine, as decoding beams, beams of the base station which correspond to upper M (M is an integer of 2 or larger) channel qualities among the channel qualities. In some other embodiments, the terminal may determine decoding beams by using a channel quality threshold value. The terminal may compare channel qualities and channel quality threshold values for the respective beams of the base station. The terminal may determine, as a decoding beam, a beam of the base station, which corresponds to a channel quality higher than the channel quality threshold value.

According to various embodiments, the terminal may determine decoding beams on the basis of channel qualities and correlations between beams. Here, the correlation may be a metric indicating similarity of directions between beams. The reason for considering the correlation is that, if radio paths formed by two beams are similar, when decoding of a system control signal transmitted using one beam fails, decoding of a system control signal transmitted using another beam is also more likely to fail. When the correlation between the two beams has a value smaller than or equal to a threshold value, the two beams may form independent paths. The terminal may acquire the system information more easily by decoding system control signals transmitted via various independent paths. Hereinafter, the disclosure describes decoding of system control signals corresponding to beams having a low correlation, but is not limited thereto. It is needless to say that according to an embodiment, the terminal may determine, as decoding beams, beams having a high correlation. By determining, as decoding beams, beams having a high correlation, a success probability of decoding may be increased while minimizing burden on a receiver of the terminal.

The correlation between beams may be determined in a variety of ways. For example, the terminal may measure signals transmitted using beams. The terminal may determine a correlation between beams on the basis of measurement information (e.g., a reception strength, an interference, and an error rate) for each beam. When a difference between measurement information for beams is smaller, the terminal may determine that a correlation between the beams is high. For another example, the terminal may determine a correlation between beams on the basis of angles of arrival (AoA) of signals transmitted using the beams. When a difference between AoAs, is greater, a probability that signals are transmitted via different physical paths is high, so the terminal may determine that a correlation between the beams is low. For another example, the terminal may determine a correlation between beams according to a distance of a resource index corresponding to each of the beams. For example, the terminal may determine that the correlation between the beams is lower when a difference of the resource index between a specific beam and another beam is greater. Here, a situation, in which the base station sequentially performs beam sweeping in accordance with physical directions of the beams of the base station, is assumed.

In some embodiments, the terminal may determine decoding candidate beams by using channel qualities and may determine decoding beams from among the decoding candidate beams on the basis of correlations between the beams. Specifically, the terminal may determine, as the decoding candidate beams, beams corresponding to a channel quality higher than the channel quality threshold value. The terminal may determine a combination of beams having a cross-correlation greater than or equal to a correlation threshold value from among the decoding candidate beams. The terminal may determine the determined combination of beams as decoding beams. The number of beams in the combination may correspond to the number of decoding beams configured to the terminal. If the number of beams is 3 or more, it may be required that correlations between all the beams are greater than or equal to the correlation threshold value.

In some embodiments, the terminal may identify a beam having a highest channel quality, that is, an optimal beam, and may determine, as decoding beams, beams having a correlation with the optimal beam, which is less than the correlation threshold value, from among the remaining beams of the base station, or may determine, as the decoding beams, upper M (M is an integer of 1 or more) beams having a low correlation. M+1 may correspond to the number of decoding beams configured to the terminal. The terminal may also determine the optimal beam as a decoding beam.

According to various embodiments, the terminal may determine decoding beams on the basis of reception beams of the terminal. The terminal may measure a plurality of signals transmitted from the base station. The plurality of signals are transmitted using beams of the base station, i.e., transmission beams. The terminal may receive a plurality of signals by using one of the reception beams of the terminal, and may receive a plurality of signals by using another reception beam. The terminal may measure channel qualities of beam pairs between the transmission beams of the base station and the reception beams of the terminal, respectively, via reception beam sweeping.

The terminal may determine an optimal beam pair (a transmission beam-reception beam combination) corresponding to each of the transmission beams of the base station. The terminal may determine transmission beams corresponding to the same reception beam, as the decoding candidate beams or the decoding beams. When the number of decoding beams is configured, the terminal may identify the decoding beams among the decoding candidate beams. As such, the terminal may receive system control signals transmitted via decoding beams, by using the same reception beam. By using the same reception beam, the terminal does not need to change a separate RF configuration, and therefore a procedure complexity of the terminal may be reduced.

According to various embodiments, the terminal may configure the number of decoding beams. The terminal may identify as many as decoding beams as the configured number. The terminal may determine the number of decoding beams. In some embodiments, the terminal may determine the number of decoding beams on the basis of information on the channel qualities determined in operation 701. For example, the terminal may determine the number of decoding beams according to the size of an average value of channel qualities. The terminal may increase the number of decoding beams when overall RSRP values are low, that is, an RSRP average value is low. This is to increase a decoding gain by combining more signals. In some other embodiments, the terminal may determine the number of decoding beams to be a fixed number. Here, the fixed number is a preconfigured value and may be determined according to a capability of the terminal. For combined decoding, since multiple pieces of channel quality information need to be stored and a combined calculation thereof needs to be performed, additional complexities may be required. For example, the terminal may determine the number of decoding beams to be four.

FIG. 7 describes terminal operations for determining decoding beams before the terminal receives system control signals. However, the disclosure is not limited thereto. According to an embodiment, the terminal may receive each of system control signals in a broadcast period and may determine decoding beams in the same broadcast period. The terminal may determine decoding beams within the broadcast period after first single decoding has failed.

In FIG. 7, terminal operations for determining decoding beams for combined decoding are described. Not only combining and decoding system control signals transmitted using decoding beams, that is, combined decoding, but also determining decoding beams and succeeding in decoding of a first signal so as to access a cell without further combined decoding, by the terminal, may also be understood as an embodiment of the disclosure. Hereinafter, FIG. 8 describes an example of a method for combining system control signals corresponding to determined decoding beams.

Combining

Figure 8:
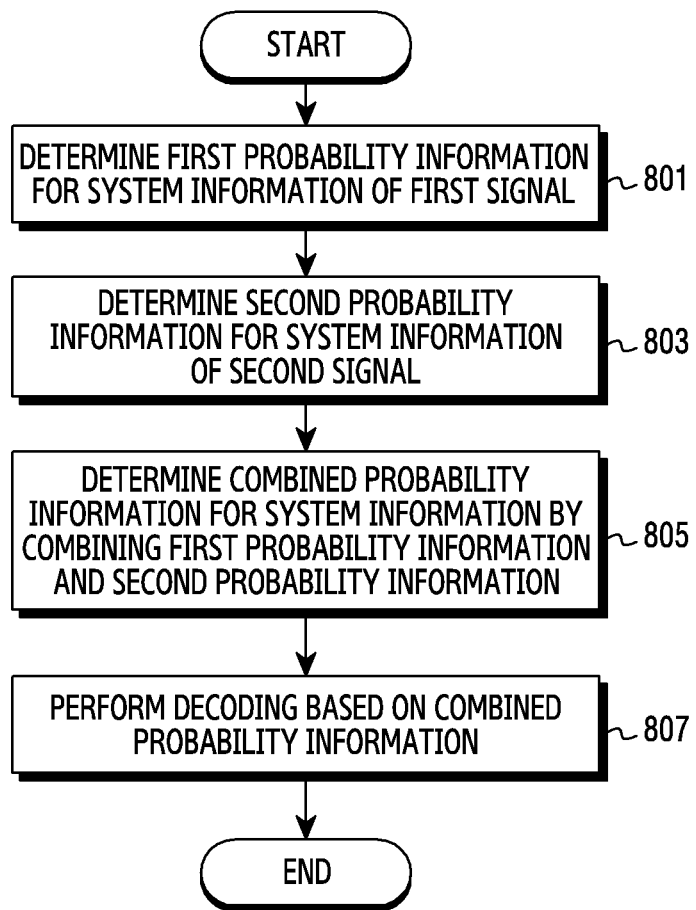
FIG. 8 illustrates a flowchart of a terminal, for combining probability information according to various embodiments of the disclosure.

FIG. 8 illustrates a flowchart of a terminal, for combining probability information according to various embodiments of the disclosure. A terminal illustrates the terminal 120 of FIG. 1. As shown in operation 605 of FIG. 6A, the terminal may perform decoding by combining system control signals after receiving the system control signals. Hereinafter, in FIG. 8, embodiments of acquiring probability information for each of system control signals, and then combining and decoding the probability information are described. The probability information may be probability information for a system control signal.

The probability information may include an indicator relating to whether a bit, a symbol, a codeword, etc. of a system control signal have a specific value or specific values. For example, the probability information may include a log likelihood ratio (LRR). The probability information may include an LLR value indicating whether each of bits constituting a system control signal is 1.

Referring to FIG. 8, in operation 801, the terminal may determine first probability information for system information of a first signal. The first signal including system information may be a first system control signal. The terminal may detect bits or symbols of the first system control signal and may determine first probability information according to a detection result. Hereinafter, a situation in which the probability information includes an LLR value is described as an example. The terminal may determine a first vector for the first system control signal in response to reception of the first system control signal. The terminal may identify at least one candidate vector among multiple estimated vectors according to Euclidean distance (ED) calculation of the first vector and each of the multiple estimated vectors. The terminal may calculate first LLR values corresponding to respective bits of system information on the basis of at least one candidate vector. For example, each LLR value may be expressed as follows.

$$LLR(b_i) = \log \frac{P(b_i = 1)}{P(b_i = 0)} \quad \text{Equation 1}$$

$b_i$ may indicate an i-th bit. $LLR(b_i)$ may be an LLR value indicating whether the i-th bit is 1. $P(b_i=1)$ means a probability that the i-th bit is "1", and $P(b_i=0)$ means a probability that the i-th bit is "0".

The terminal may determine the first probability information including the first LLR values.

In operation 803, the terminal may determine second probability information for system information of a second signal. The second signal including system information may be a second system control signal. The terminal may detect bits or symbols of the second system control signal in the same manner as the first system control signal, and may determine the second probability information according to a detection result. As an example, the terminal may determine second LLR values for the second system control signal. The terminal may determine the second probability information including the second LLR values.

In operation 805, the terminal may combine the first probability information and the second probability information, so as to determine combined probability information for system information. The terminal may combine the first probability information and the second probability information. The first system control signal and the second system control signal may include the same system information. That is, the first probability information for the first system control signal and the second probability information for the second system control signal refer to probability information for the same content. For example, the first probability information may include first LLR values of bits of the first system control signal. The second probability information may include second LLR values of bits of the second system control signal. Since the first system control signal and the second system control signal are modulated in the same manner (e.g., quadrature phase shift keying (QPSK)) and include the same system information, parameters or fields constituting the system information may correspond to the same bit position.

Depending on a detection result, at the same bit position, bit values may differ. The terminal may determine combined probability information for a corresponding bit or symbol by combining the first probability information and the second probability information at a specific bit or symbol position. For example, if the first probability information and the second probability information include LLR values, the terminal may determine a combined LLR value of the i-th bit by adding a first LLR value of the i-th bit and a second LLR value of the i-th bit. The combined probability information may include combined LLR values for bits of the system information.

When the terminal combines the first probability information and the second probability information, a different weight may be applied to each piece of probability information. The terminal may determine the combined probability information by applying the first probability information and a first weight and applying a second weight to the second probability information. In some embodiments, the first weight and the second weight may be determined based on a channel quality. For example, if a channel quality of the first system control signal is higher than a channel quality of the second system control signal, the terminal may configure the first weight to be greater than the second weight. As another example, the terminal may determine the first weight and the second weight on the basis of the channel quality for the beams instead of the channel quality of system control signals. The terminal may determine the first weight and the second weight on the basis of information on the channel quality for each beam used to determine decoding beams.

In some embodiments, if each of the system control signals shares the same system information and further includes some other parameters (e.g., an index of the system control signal), the terminal may perform combined decoding by compensating for different parts and combining the system control signals. The terminal may acquire system information by performing combined decoding.

In operation 807, the terminal may perform decoding based on the combined probability information. The terminal may acquire a decoding result based on the combined probability information. For example, the terminal may acquire the decoding result by performing determination according to the combined LLR values. If decoding is successful, the terminal may acquire system information. If the system information is acquired, even if there is a remaining decoding resource in which decoding has not been attempted, the terminal may no longer perform a decoding attempt.

FIG. 8 describes that two pieces of probability information are combined, but the disclosure is not limited thereto. It is needless to say that the terminal may combine three or more pieces of probability information. In some embodiments, the terminal may sequentially increase the number of combined signals up to a total number of decoding beams each time when a system unit period arrives. If the number of decoding beams is 3 or more, the terminal may combine 3 or more pieces of probability information. In some other embodiments, the number of signals to be combined may be configured within a fixed number. Each time when a system unit period arrives, the terminal may combine probability information within a fixed number (e.g., 3). For example, the number of pieces of probability information to be combined may be determined according to a capability of the terminal.

In FIG. 8, embodiments for combining probability information have been described, but combining signals themselves in addition to probability information may also be considered. The terminal may directly combine system control signals before detecting symbols or bits of each system control signal. The terminal may detect symbols or bits from a combined signal and may perform decoding according to a detection result. For example, a modulation scheme of the system control signals may be QPSK. The terminal may acquire a combined signal by combining phase information of the first system control signal and phase information of the second control signal.

It is needless to say that weights between signals may be differently applied when the signals are directly combined, just as the weights between the signals are differently applied when probability information is combined. According to various embodiments, the terminal may perform decoding by applying the first weight to the first signal and the second weight to the second signal. The first weight and the second weight may be determined based on the channel quality for the first signal and the channel quality for the second signal.

Figure 9:
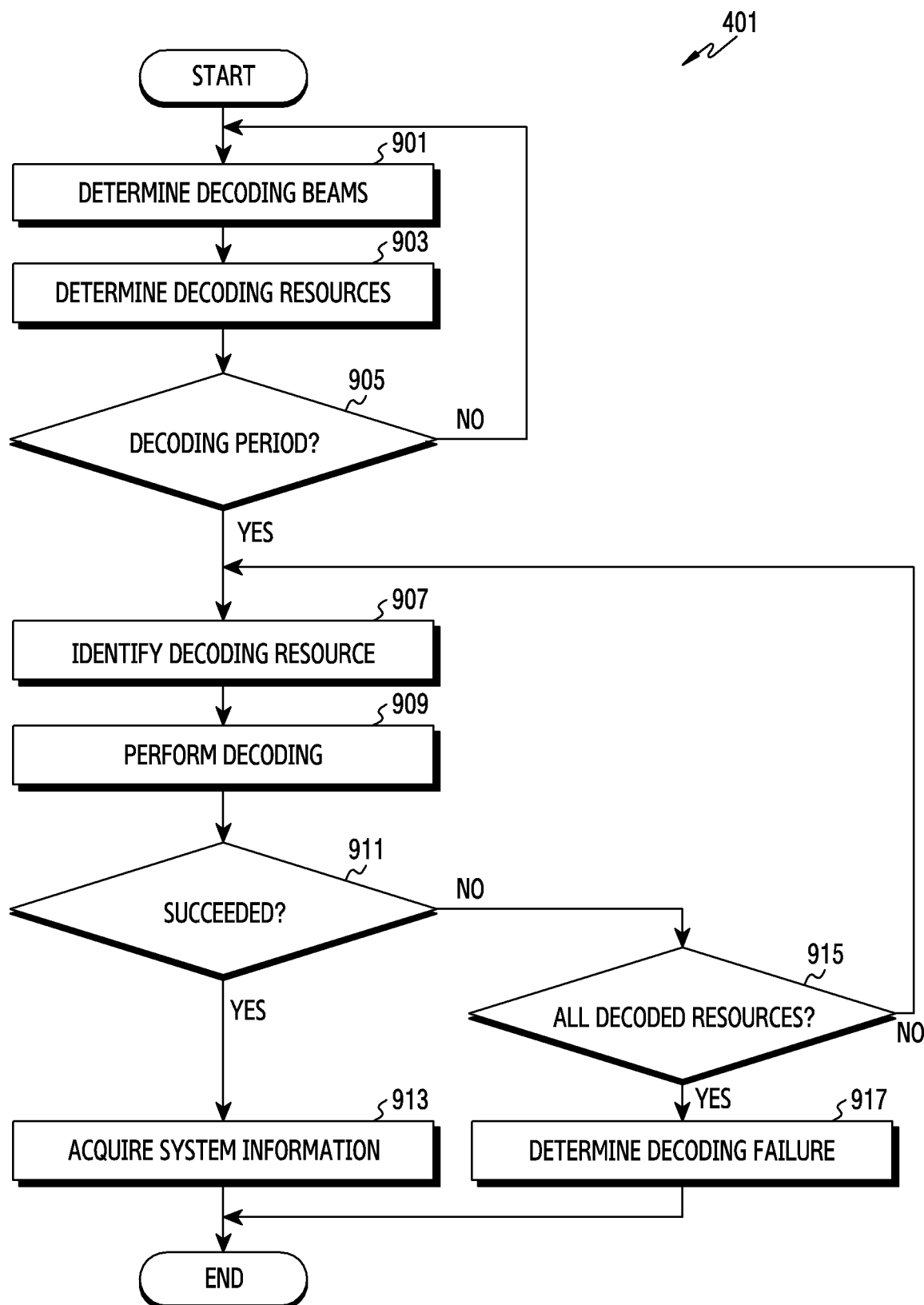
FIG. 9 illustrates a flowchart of a terminal, for acquiring system information according to various embodiments of the disclosure.

FIG. 9 illustrates a flowchart of a terminal, for acquiring system information according to various embodiments of the disclosure. A terminal illustrates the terminal 120 of FIG. 1.

Referring to FIG. 9, in operation 901, the terminal may determine decoding beams. A decoding beam may be a beam corresponding to a signal decoded by the terminal from among beams of the base station. According to various embodiments, the terminal may determine decoding beams on the basis of channel qualities. For example, the terminal may determine a BRSRP by measuring a BRS transmitted via different beams. The terminal may determine upper M number of beams having a large BRSRP, as decoding beams.

As another example, the terminal may determine an SS block RSRP by measuring an SS block transmitted via different beams. The terminal may determine upper M number of beams having a large SS block RSRP, as decoding beams.

In operation 903, the terminal may determine decoding resources. The terminal may identify system unit periods corresponding to decoding beams from a broadcast period(s). The terminal may determine system unit periods corresponding to decoding beams, as decoding resources. For example, the terminal may calculate and store a position of a symbol to which a decoding beam is assigned. As another example, the terminal may calculate and store positions of symbols to which a decoding beam is assigned or a position in a slot to which the decoding beam is assigned.

In operation 905, the terminal may determine whether or not a decoding period has arrived. The decoding period refers to a period in which the terminal performs decoding from among broadcast periods. For example, the terminal may determine, as a decoding period, a broadcast period in which an optimal terminal beam is scheduled during beam tracking. The decoding period may be determined to be not only one broadcast period, but also a plurality of broadcast periods, or may be determined to be a part of the broadcast periods.

If a subsequent broadcast period is not a decoding period, operation 901 may be performed again. The terminal may update the decoding beams by measuring signals in the broadcast period. Unlike the description in FIG. 9, the terminal may wait until a decoding period arrives. If the subsequent broadcast period is a decoding period, the terminal may perform operation 907. For example, the terminal may determine whether decoding resources calculated in an MIB/SIB subframe exist.

In operation 907, the terminal may identify decoding resources. Among the decoding resources determined in operation 903, the terminal may identify a decoding resource in which decoding has not been attempted. If first decoding is performed in the decoding period, the terminal may identify a decoding resource that is temporally advanced from among the decoding resources. For example, if the decoding resource is a 3rd symbol, a 5th symbol, and a 9th symbol among 14 symbols, the terminal may identify the 3rd symbol as the decoding resource. If decoding is not first decoding in the decoding period, the terminal may determine remaining decoding resources, in which decoding has not been attempted, from among the decoding resources. The terminal may identify a temporally preceding decoding resource among the remaining decoding resources. That is, if operation 907 is performed after operation 915, the terminal may identify a decoding resource that arrives first in time from among the remaining decoding resources. For example, in a situation where the decoding resources are the 3rd symbol, the 5th symbol, and the 9th symbol among 14 symbols, if an attempt to decode in the 3rd symbol that is a first decoding resource fails, the terminal may identify the fifth symbol as a decoding resource.

In operation 909, the terminal may perform decoding. The terminal may attempt decoding in the decoding resource. The terminal may receive the system control signal from the decoding resource identified in operation 907. The terminal may attempt to decode the system control signal on the decoding resource.

According to various embodiments, the terminal may perform single decoding. Single decoding refers to decoding performed without combination between system control signals. For example, the terminal may perform single decoding in the case of first decoding in the decoding period. In a situation where the decoding resources are the 3rd symbol, the 5th symbol, and the 9th symbol among 14 symbols of the decoding period, the terminal may attempt decoding in the 3rd symbol within the decoding period. As another example, the terminal may perform single decoding even if it is not first decoding in the decoding period. The terminal may perform single decoding at each decoding attempt repeated on a decoding resource.

According to various embodiments, the terminal may perform combined decoding. Combined decoding refers to decoding performed via a combination between system control signals. Here, the combination may include not only a combination of information (e.g., a signal detection result, probability information, or statistical information) related to signals but also a combination of physical signals. The terminal may increase a decoding success probability by combining signals. That is, the terminal may increase a probability of acquiring system information by performing combined decoding. For example, the terminal may perform combined decoding by performing LLR combining between system control signals transmitted via respective beams.

If it is not first decoding in the decoding period, the terminal may perform combined decoding. For example, if previously attempted decoding has failed, the terminal may perform combined decoding based on a system control signal in a currently identified decoding resource and previously failed decoding results. If decoding in the third symbol that is the decoding resource has failed, decoding may be attempted by combining the system control signal transmitted in the third symbol and the system control signal transmitted in the fifth symbol. As another example, if the previously attempted decoding and the decoding in the currently identified decoding resource have failed, the terminal may combine the failed decoding results to perform combined decoding. If decoding in the third and fifth symbols that are decoding resources has failed, decoding may be attempted by combining the system control signal transmitted in the third symbol and the system control signal transmitted in the fifth symbol.

According to an embodiment, even if it is not first decoding in the decoding period, if there is prior information (e.g., information acquired in the previous broadcast period) relating to the system information, the terminal may combine the prior information with information related to the first system control signal so as to perform combined decoding.

In operation 911, the terminal may determine whether decoding is successful. The success or failure of decoding may be determined based on a cyclic redundancy check (CRC) test. If decoding is successful, the terminal may perform operation 913. If decoding fails, the terminal may perform operation 915.

In operation 913, the terminal may acquire the system information. Accordingly, even if there are remaining decoding resources, the terminal may not make an additional decoding attempt in the decoding resources.

In operation 915, the terminal may determine whether decoding has been attempted in all decoding resources. If a decoding attempt is not made in all decoding resources, the terminal may perform operation 907 again. That is, the terminal may perform operation 907 if there is a decoding resource (hereinafter, a remaining decoding resource) in which a decoding attempt has not been made from among the decoding resources. If a decoding attempt has been made in all decoding resources, the terminal may perform operation 917.

In operation 917, the terminal may determine a decoding failure. If decoding has failed, the terminal may end system information acquisition procedures. Thereafter, the terminal may repeat procedures in operations 911 to 917. The terminal may repeatedly attempt decoding to acquire the system information.

Figure 10:
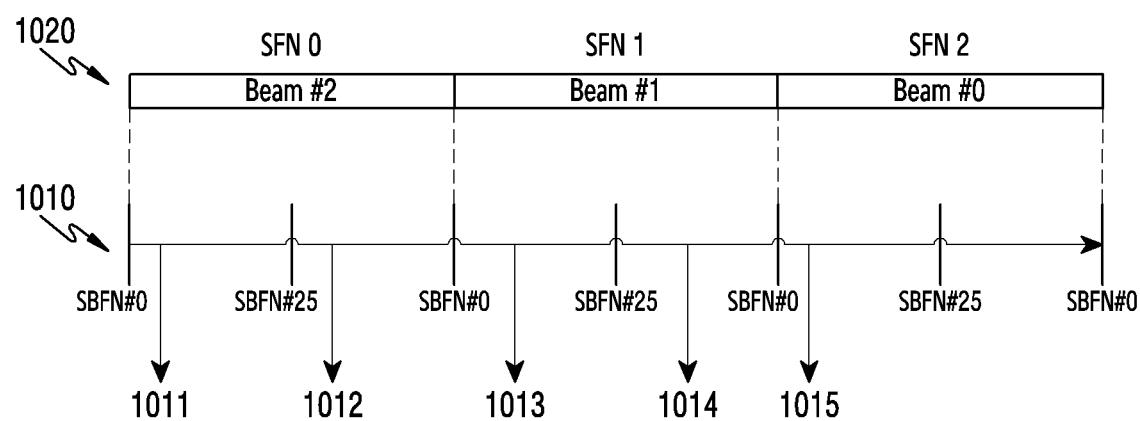
FIG. 10 illustrates an example of acquiring system information according to various embodiments of the disclosure.

FIG. 10 illustrates an example of acquiring system information according to various embodiments of the disclosure. A base station may transmit a system control signal including system information by using a beam. In FIG. 10, a situation, in which a terminal sweeps beams of the terminal for beam tracking, is described as an example. The terminal may change a beam of the terminal for each frame, and may receive system control signals by using the respective beams of the terminal. The beam of the terminal may be a downlink reception beam. The base station may change a beam of the base station within a frame, and may transmit system control signals by using respective beams of the base station. The beam of the base station may be a downlink transmission beam.

Referring to FIG. 10, a timing diagram 1010 shows a time flow of the base station. The timing diagram 1020 shows the time flow of the base station. In the timing diagram 1010 and a timing diagram 1020, the same point on the vertical axis refers to the same time point.

The terminal may receive a signal by using beam #2 of the terminal in a first frame 1021. A frame number of the first frame 1021, that is, a system frame number (SFN), may be SFN #0. The terminal may receive a signal by using beam #1 of the terminal in a second frame 1022. A frame number of the second frame 1022 may be SFN #1. The terminal may receive a signal by using beam #0 of the terminal in a third frame 1023. A frame number of the third frame 1023 may be SFN #2.

The base station may transmit system control signals in a first broadcast period 1011. The base station may transmit a system control signal via different beams of the base station. Like in the first broadcast period 1011, the base station may transmit a system control signal in a second broadcast period 1012, a third broadcast period 1013, a fourth broadcast period 1014, and a fifth broadcast period 1015. In an example shown in FIG. 10, each broadcast period may be a 0th subframe or a 25th subframe in a frame. That is, the first broadcast period 1011 may be subframe number (SBFN) #0 of SFN #0. The second broadcast period 1012 may be subframe number (SBFN) #25 of SFN #0. The third broadcast period 1013 may be subframe number (SBFN) #0 of SFN #1. The fourth broadcast period 1014 may be subframe number (SBFN) #25 of SFN #1. The fifth broadcast period 1015 may be subframe number (SBFN) #0 of SFN #2.

In the second broadcast period 1012, the terminal may acquire a system frame number and a subframe number. The terminal may determine whether a subsequent frame is an optimal beam (or a serving beam) of the terminal, that is, whether a decoding period arrives. The terminal may determine decoding beams when the decoding period arrives. The terminal may determine decoding resources corresponding to decoding beams. For example, decoding resources may be symbols. The terminal may determine four symbols. The terminal may determine a position on a time resource of each of four symbols. Although a symbol is described as an example, the terminal may determine a position of a subframe number or frame number in addition to symbol. The terminal may attempt decoding at a determined position when the decoding period arrives.

The terminal may perform decoding in a period in which an optimal beam of the terminal is scheduled. The terminal may determine the second frame 1022 as the decoding period. In the third broadcast period 1013 and the fourth broadcast period 1014, the terminal may attempt decoding in decoding resources. The terminal may decode a system control signal. Depending on the position of the decoding resources acquired in a previous broadcast period, the terminal may attempt decoding. The terminal may reset the number of remaining decoding resources according to a decoding attempt result.

In the fifth broadcast period 1015, the terminal may process a decoding result. If decoding is successful, the terminal may acquire system information. For example, the terminal may acquire an MIB. The terminal may acquire SIB1 on the basis of the MIB. The terminal may access a cell on the basis of the MIB and SIB1. Thereafter, the terminal may establish an RRC connection to the base station via a random access procedure and may perform communication. If decoding fails, the terminal may wait. Thereafter, the terminal may determine decoding beams again to access the cell, and may attempt to acquire system information. For example, the terminal may wait until a subsequent optimal beam (beam #1) of the terminal is scheduled. The terminal may receive signals transmitted from the base station until the subsequent optimal beam of the terminal is scheduled, so as to update the decoding beams.

FIG. 10 illustrates an example in which a plurality of subframes are present in a frame, and a specific subframe includes a transmission opportunity for a system control signal. However, the disclosure is not limited to subframe-based transmission. According to various embodiments, system control signals may be transmitted according to slot-based scheduling. For example, one frame may include at least one slot. Each slot may include 14 symbols. A slot may include two system control signals (SS blocks). The number of slots in the frame may be changed according to a configuration of SCS. The terminal may receive system control signals and may determine decoding beams, on the basis of a resource structure determined according to the configuration of the SCS.

FIG. 5 to FIG. 10 describe a method for receiving, combining, and decoding system control signals transmitted using different beams, so as to increase a probability of acquiring system information. As described above, in order to determine decoding beams for combined decoding and combine signals, the terminal is required to store, compare, and manage beam-specific channel qualities. When a high frequency band is supported, the number of beams for covering a cell increases. When the number of pieces of information to be managed increases along with an increase of the number of beams, a method for managing information for each beam is additionally required.

Beam Information

Figure 11:
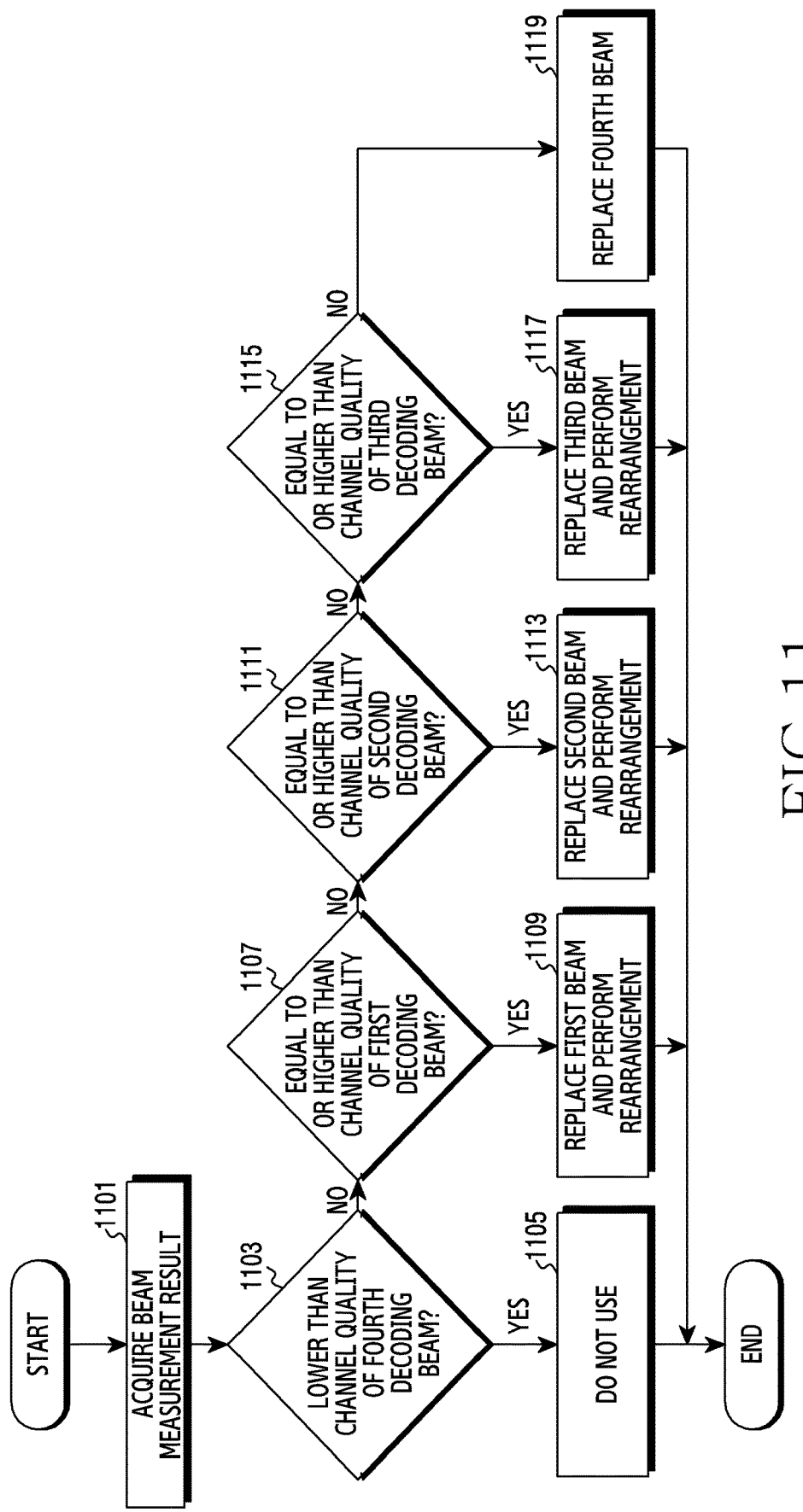
FIG. 11 illustrates a flowchart of a terminal, for managing beam information according to various embodiments of the disclosure.

FIG. 11 illustrates a flowchart of a terminal, for managing beam information according to various embodiments of the disclosure. A terminal illustrates the terminal 120 of FIG. 1. The terminal may store and manage beam information for each beam to determine decoding beams. The terminal may store and manage beam information for each of beams (hereinafter, a system beam set) used when signals (e.g., an MIB and an SIB) including system information are transmitted. In FIG. 11, an embodiment in which a system beam set includes four beams is described. Beams included in the system beam set may be referred to as decoding beam candidates.

Referring to FIG. 11, in operation 1101, the terminal may acquire a beam measurement result. The beam measurement result may be a channel quality for a beam. The terminal may measure a quality of a signal transmitted using a specific beam in a specific time resource (e.g., a system unit period) and may determine a channel quality. The terminal may determine the channel quality for the specific beam. In a subsequent procedure, the terminal may determine whether to store, as a decoding beam candidate, the channel quality for the specific beam. A beam to be subject to determination of whether to be stored as a decoding beam candidate may be referred to as a "target beam".

In operation 1103, the terminal may determine whether a channel quality of the target beam is lower than that of a fourth decoding beam. If the channel quality of the target beam is lower than the channel quality of the fourth decoding beam, the terminal may perform operation 1105. If the channel quality of the target beam is higher than the channel quality of the fourth decoding beam, the terminal may perform operation 1107.

In operation 1105, the terminal may determine that the channel quality of the target beam is not used as a decoding beam candidate. The terminal may discard the channel quality of the target beam.

In operation 1107, the terminal may determine whether the channel quality of the target beam is equal to or higher than that of a first decoding beam. If the channel quality of the target beam is equal to or higher than the channel quality of the first decoding beam, the terminal may perform operation 1109. If the channel quality of the target beam is lower than the channel quality of the first decoding beam, the terminal may perform operation 1111.

In operation 1109, the terminal may replace the channel quality of the target beam and the second beam. Thereafter, the terminal may perform rearrangement. The rearrangement may be performed between the existing first beam, a second beam, a third beam, and the fourth beam. The terminal may perform rearrangement so that the second, third, and fourth beams of the system beam set maintain a tree structure. After performing the rearrangement, the terminal may exclude a beam having a lowest priority from the system beam set. For example, the terminal may exclude the fourth beam. According to various embodiments, the terminal may perform rearrangement by applying a priority queue algorithm. The terminal may perform treeifying for rearrangement of the channel qualities or decoding beams of the beam set configured in a tree structure.

In operation 1111, the terminal may determine whether the channel quality of the target beam is equal to or higher than a channel quality of the second decoding beam. If the channel quality of the target beam is equal to or higher than the channel quality of the second decoding beam, the terminal may perform operation 1113. If the channel quality of the target beam is lower than the channel quality of the second decoding beam, the terminal may perform operation 1115.

In operation 1113, the terminal may replace the channel quality of the target beam and the second beam. Thereafter, the terminal may perform rearrangement. The terminal may perform rearrangement in the same manner as in operation 1109. According to an embodiment, the terminal may not include the first beam as an object to be rearranged.

In operation 1115, the terminal may determine whether the channel quality of the target beam is equal to or higher than a channel quality of the third decoding beam. If the channel quality of the target beam is equal to or higher than the channel quality of the third decoding beam, the terminal may perform operation 1117. If the channel quality of the target beam is lower than the channel quality of the third decoding beam, the terminal may perform operation 1119.

In operation 1117, the terminal may replace the channel quality of the target beam and the third beam. Thereafter, the terminal may perform rearrangement. The terminal may perform rearrangement in the same manner as in operation 1109. According to an embodiment, the terminal may not include the first and second beams as objects to be rearranged.

In operation 1119, the terminal may replace the channel quality of the target beam and the fourth beam. The terminal manages up to 4 decoding beams, and therefore additional rearrangement may not be performed.

In order to identify M decoding beams among N beams of the base stations, arrangement of measurement data (e.g., RSRP) for N beams may generally be preceded. By arranging N pieces of data and identifying M beams, the complexity of $O(n^2)$ or $O(n \cdot \log n)$ may be required. That is, in order to determine a plurality of decoding beams, if decoding is performed in each broadcast period and rearrangement is performed for all beams, it may act as a burden on processing of the terminal. A processing time varies according to the number of beams of the base station, and an unexpected delay may thus occur. Therefore, as illustrated in FIG. 11, the complexity may be reduced by maintaining upper M number of beams via simple comparison. In addition, the terminal does not perform rearrangement of data for all beams, and it may thus be possible to efficiently store, identify, and manage M beams within a constant time.

Figure 12:
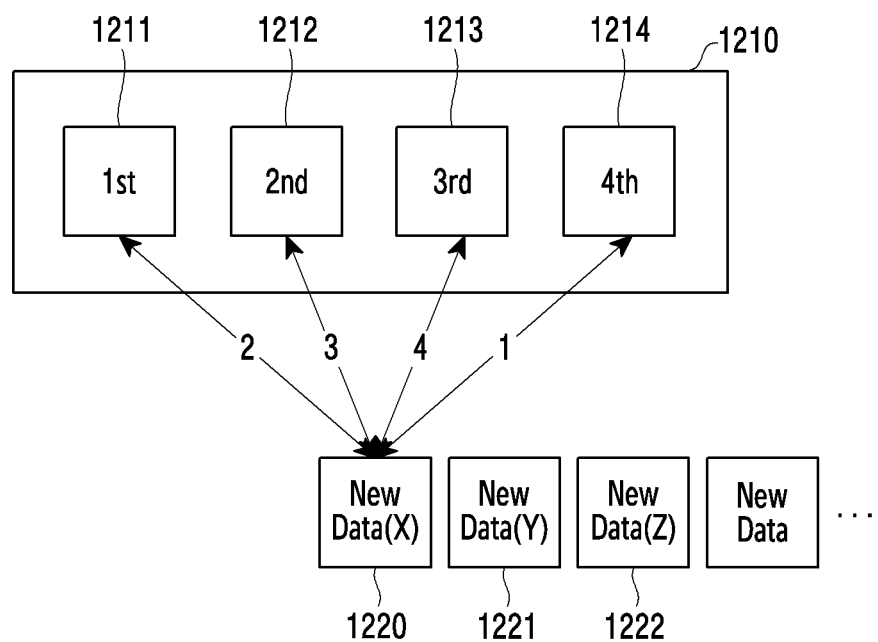
FIG. 12 illustrates an example of managing beam information according to various embodiments of the disclosure.

FIG. 12 illustrates an example of managing beam information according to various embodiments of the disclosure. A terminal may include a database (DB) for beam information to manage the beam information. The database may include a system beam set 1210. As shown in FIG. 11, an embodiment in which the system beam set includes four beams is described.

Referring to FIG. 12, the system beam set 1210 may include a first channel quality 1211 of a first beam having a highest channel quality, a second channel quality 1212 of a second beam having a second highest channel quality, a third channel quality 1213 of a third beam having a third highest channel quality, and a fourth channel quality 1214 of a fourth beam having a fourth highest channel quality.

The terminal may measure a quality of a signal each time when the signal is transmitted via a different beam of the base station, and may determine a channel quality for the corresponding beam. The terminal may determine a first channel quality 1220 for a target beam (x). That is, the terminal may newly acquire data for the first channel quality 1220. The terminal may compare the acquired new data with data for beams of an existing system beam set. According to various embodiments, as described in FIG. 11, the terminal may first compare the newly acquired data with a channel quality of a beam having a lowest priority, and then may sequentially perform comparison with a beam having a highest priority. For example, the terminal may first compare a channel quality of the target beam with a channel quality of a fourth beam 1214, and then may compare channel qualities of beams in the order of a first beam 1211, a second beam 1212, and a third beam 1213. If it is determined that the channel quality of the target beam is higher than that of a specific beam in the beams of the system beam set, the terminal may replace the target beam and the specific beam.

The terminal may no longer perform comparison and may rearrange the system beam set.

The terminal may determine a second channel quality 1221 for a target beam (Y). Like beam X, the terminal may compare the second channel quality 1221 with each of the channel qualities of the beams in the system beam set. The terminal may determine a third channel quality 1222 for a target beam (Z). Like beam X or beam Y, the terminal may compare the third channel quality 1222 with each of the channel qualities of the beams in the system beam set. That is, the terminal may determine the channel quality for the target beam each time when a beamforming signal is received. The terminal may compare the channel quality for the target beam with each of the channel qualities of the beams of the system beam set.

In FIG. 11 and FIG. 12, an example of managing four decoding beams as a system beam set has been described, but the disclosure is not limited thereto. The terminal may store fewer than 4 decoding beams or more than 4 decoding beams in the system beam set in order to acquire system information.

The terminal may store not only a channel quality for each beam of the system beam set, but also resource information related to the beam. By storing the resource information, the terminal may easily identify a resource position of a signal transmitted using the corresponding beam in a broadcast period. That is, the terminal may identify the beam on the basis of the resource information. The resource information indicating a beam in this manner may be referred to as a resource indicator. Hereinafter, FIG. 13 describes a method for storing, by a terminal, resource information associated with each beam of a system beam set.

Resource Information

Figure 13:
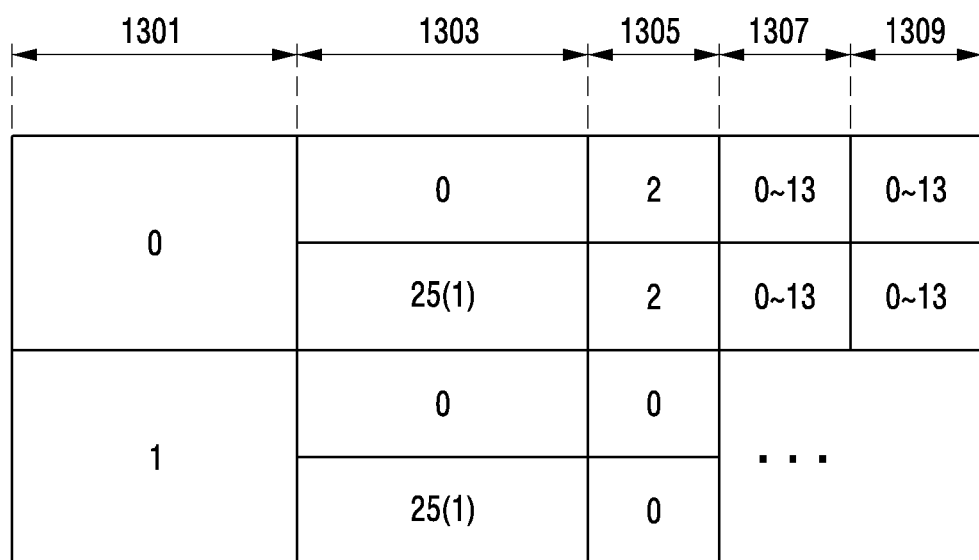
FIG. 13 illustrates an example of resource information related to a beam according to various embodiments of the disclosure.

FIG. 13 illustrates an example of resource information related to a beam according to various embodiments of the disclosure. Here, a beam is for a system control signal of a terminal, and may be a decoding beam that is to be decoded. The terminal may store resource information for the decoding beam.

Referring to FIG. 13, the terminal may store resource information in a hierarchical structure form on each resource. According to various embodiments, the resource information may include a first parameter 1301, a second parameter 1303, a third parameter 1305, a fourth parameter 1307, and a fifth parameter 1309. The first parameter 1301 may refer to a frame number. That is, the first parameter 1301 may be SFN. The second parameter 1303 may refer to a subframe number. The third parameter 1305 may refer to the number of symbols. Each of the fourth parameter 1307 and the fifth parameter 1309 may refer to a symbol index.

A situation, in which a base station transmits a system control signal by using each of a predetermined number of beams every 5 ms, is described as an example. The first parameter 1301 may refer to a frame number. A broadcast period exists in each frame, and therefore the first parameter 1301 may include SFNs. The terminal may store SFNs in ascending order increasing by one. The second parameter 1302 may refer to a subframe number. A 0th subframe and a 25th subframe may be broadcast periods. The second parameter 1302 may indicate 0 and 25.

Due to characteristics of a communication system, decoding may be attempted and combination may be performed in more than one symbol even within one subframe. Accordingly, the terminal may store the number of symbols in the third parameter 1305. If the number of decoding beams is 2 in one subframe, the terminal may store, as 2, a value of the third parameter 1305. Depending on the value of the third parameter 1305, the number of subsequent parameters may be determined. If the third parameter 1305 is 2, the terminal may include the fourth parameter 1307 and the fifth parameter 1309.

The fourth parameter 1307 may indicate an index of a symbol corresponding to a decoding beam. A subframe may include 14 symbols. The fourth parameter 1307 may be one of 0 to 13. The fifth parameter 1309 may indicate an index of a symbol corresponding to another decoding beam. The fifth parameter 1309 may be one of 0 to 13.

In FIG. 13, resource information is described on the basis of a communication system in which one frame includes 50 subframes and system control signals are transmitted in two subframes. However, the disclosure is not limited thereto. The terminal may include resource information based on another resource structure. According to an embodiment, the resource information may further include parameters indicating a slot, the number of slots, and a half frame.

According to various embodiments, the terminal may use resource information to determine whether beams of a system beam set are scheduled in a broadcast period or a decoding period. That is, the terminal may use resource information to determine whether the base station transmits system control signals by using the beams of the system beam set. The terminal may attempt to decode the system control signals transmitted using the beams of the system beam set, on decoding resources of the resource information.

As described in FIG. 5 to FIG. 13, the terminal according to various embodiments of the disclosure may acquire beam diversity by combined-decoding system control signals transmitted using different beams. Specifically, the performance for successfully acquiring system information may be improved by receiving signals also in other beams and performing decoding via an LLR combination, as well as performing decoding to acquire the system information only in a single optimal beam. When the number of combinations increases, a reception gain may increase by about 3 dB.

Combined decoding according to various embodiments provides an improvement in reception performance. Whether to perform combined decoding of the disclosure may be determined by measuring the reception performance in a weak electric field (−100 dBm or −110 dBm) and confirming that the reception gain is increased. According to various embodiments, whether to perform combined decoding of the disclosure may be determined based on whether the terminal performs decoding in another beam in addition to a specific beam within a broadcast period in which system information is transmitted. For example, the terminal may attempt decoding on a resource different from a resource that is fed back to the base station within the same broadcast period.

Although the disclosure has been described based on a situation in which a base station broadcasts system information, the disclosure may also be applied to a situation in which the base station repeatedly transmits not only system information but also base station-specific or cell-specific parameters by sweeping beams. In addition, embodiments of the disclosure may also be applied to a situation in which a terminal receives data (e.g., PDSCH) transmitted using at least two beams (e.g., CRIs or SSBRIs) of a base station.

In the disclosure, the expression "equal to or greater than" or "equal to or less than" is used to determine whether a specific condition is satisfied (fulfilled), but this is merely a description to represent an example and does not exclude "exceeding" or "less than". For example, a condition described as "equal to or more than" may be replaced by "exceeding", a condition described as "equal to or less/fewer than" may be replaced by "less/fewer than", a condition described as "exceeding" may be replaced by "equal to or more than", a condition described as "less/fewer than" may be replaced by "equal to or less/fewer than", a condition described as "equal to or more than, and less/fewer than" may be replaced by "exceeding, and equal to or less/fewer than", and a condition described as "exceeding, and equal to or less/fewer than" may be replaced by "equal to or more than, and less/fewer than".

Methods disclosed in the claims and/or methods according to various embodiments described in the specification of the disclosure may be implemented by hardware, software, or a combination of hardware and software.

When the methods are implemented by software, a computer-readable storage medium for storing one or more programs (software modules) may be provided. The one or more programs stored in the computer-readable storage medium may be configured for execution by one or more processors within the electronic device. The at least one program may include instructions that cause the electronic device to perform the methods according to various embodiments of the disclosure as defined by the appended claims and/or disclosed herein.

The programs (software modules or software) may be stored in nonvolatile memories including a random access memory and a flash memory, a read only memory (ROM), an electrically erasable programmable read only memory (EEPROM), a magnetic disc storage device, a compact disc-ROM (CD-ROM), digital versatile discs (DVDs), or other type optical storage devices, or a magnetic cassette. Alternatively, any combination of some or all of them may form a memory in which the program is stored. Further, a plurality of such memories may be included in the electronic device.

In addition, the programs may be stored in an attachable storage device which may access the electronic device through communication networks such as the Internet, Intranet, Local Area Network (LAN), Wide LAN (WLAN), and Storage Area Network (SAN) or a combination thereof. Such a storage device may access the electronic device via an external port. Further, a separate storage device on the communication network may access a portable electronic device.

In the above-described detailed embodiments of the disclosure, an element included in the disclosure is expressed in the singular or the plural according to presented detailed embodiments. However, the singular form or plural form is selected appropriately to the presented situation for the convenience of description, and the disclosure is not limited by elements expressed in the singular or the plural. Therefore, either an element expressed in the plural may also include a single element or an element expressed in the singular may also include multiple elements.

Although specific embodiments have been described in the detailed description of the disclosure, modifications and changes may be made thereto without departing from the scope of the disclosure. Therefore, the scope of the disclosure should not be defined as being limited to the embodiments, but should be defined by the appended claims and equivalents thereof

The invention claimed is:

1. A method performed by a terminal in a wireless communication system, the method comprising:
   receiving, from a base station, a first synchronization signal (SS) block, which is transmitted using a first beam of the base station, wherein the first SS block includes system information;
   receiving, from the base station, a second SS block, which is transmitted using a second beam of the base station, wherein the second SS block includes the system information; and
   acquiring the system information by decoding the second SS block in combination with the first SS block based on first probability information of the first SS block and second probability information of the second SS block.

2. The method of claim 1,
   wherein each of the first probability information and the second probability information comprises LLR (log likelihood ratio), and
   wherein the LLR indicates whether each value of bits of a SS block including the first SS block and the second SS block is 1 or not.

3. The method of claim 2, the method further comprising:
   determining a first vector corresponding to the first probability information of the first SS block based on detection of the first SS block; and
   determining a second vector corresponding to the second probability information of the second SS block based on detection of the second SS block.

4. The method of claim 1,
   wherein the first SS block is modulated based on a modulation scheme, and
   wherein the second SS block is modulated based on the modulation scheme.

5. The method of claim 1, wherein the system information is at least of parameters of a system information block (SIB) or a master information block (MIB).

6. The method of claim 1, wherein the acquiring of the system information comprises:
   acquiring combined probability information for the system information based on the first probability information and the second probability information.

7. The method of claim 1,
   wherein the acquiring of the system information comprises performing the decoding by applying a first weight to the first SS block and applying a second weight to the second SS block, and
   wherein the first weight and the second weight are determined based on a first channel quality for the first SS block and a second channel quality for the second SS block.

8. The method of claim 1, wherein the acquiring of the system information comprises:
   decoding the second SS block in combination with the first SS block in response to detection of a failure of decoding the first SS block.

9. The method of claim 1, wherein a number of combined SS blocks for the system information is determined based on a time duration for the system information or a capability of the terminal.

10. The method of claim 1,
    wherein the first SS block includes a first index associated with the first beam, and
    wherein the second SS block includes a second index associated with the second beam.

11. A terminal in a wireless communication system, comprising:
    a transceiver; and
    at least one processor coupled with the transceiver,
    wherein the at least one processor is configured to:
        receive, from a base station, a first synchronization signal (SS) block, which is transmitted using a first beam of the base station, wherein the first SS block includes system information, receive, from the base station, a second SS block, which is transmitted using a second beam of the base station, wherein the second SS block includes the system information, and acquire the system information by decoding the second SS block in combination with the first SS block based on first probability information of the first SS block and second probability information of the second SS block.

12. The terminal of claim 11, wherein each of the first probability information and the second probability information comprises LLR (log likelihood ratio), and wherein the LLR indicates whether each value of bits of a SS block including the first SS block and the second SS block is 1 or not.

13. The terminal of claim 12, wherein the at least one processor is further configured to:

determine a first vector corresponding to the first probability information of the first SS block based on detection of the first SS block, and determine a second vector corresponding to the second probability information of the second SS block based on detection of the second SS block.

14. The terminal of claim 11, wherein the first SS block is modulated based on a modulation scheme, and wherein the second SS block is modulated based on the modulation scheme.

15. The terminal of claim 11, wherein the system information is at least of parameters of a system information block (SIB) or a master information block (MIB).

16. The terminal of claim 11, wherein the at least one processor is further configured to:

acquire combined probability information for the system information based on the first probability information and the second probability information.

17. The terminal of claim 11, wherein the at least one processor is further configured to perform the decoding by applying a first weight to the first SS block and applying a second weight to the second SS block, and wherein the first weight and the second weight are determined based on a first channel quality for the first SS block and a second channel quality for the second SS block.

18. The terminal of claim 11, wherein the at least one processor is further configured to:

decode the second SS block in combination with the first SS block in response to detection of a failure of decoding the first SS block.

19. The terminal of claim 11, wherein a number of combined SS blocks for the system information is determined based on a time duration for the system information or a capability of the terminal.

20. The terminal of claim 11, wherein the first SS block includes a first index associated with the first beam, and wherein the second SS block includes a second index associated with the second beam.

* * * * *